United States Patent
Kang et al.

(10) Patent No.: US 8,111,342 B2
(45) Date of Patent: Feb. 7, 2012

(54) DISPLAY SUBSTRATE, METHOD OF MANUFACTURING THE SAME AND DISPLAY DEVICE USING THE DISPLAY SUBSTRATE

(75) Inventors: Shin-Tack Kang, Yongin-si (KR);
Jong-Huan Lee, Anyang-si (KR);
Hong-Woo Lee, Asan-si (KR);
Hyeon-Hwan Kim, Asan-si (KR);
Byeong-Jae Ahn, Suwon-Si (KR);
Gyu-Tae Kim, Seoul (KR);
Jong-Woong Chang, Asan-si (KR);
Jong-Hyuk Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 854 days.

(21) Appl. No.: 12/129,198

(22) Filed: May 29, 2008

(65) Prior Publication Data
US 2008/0297677 A1    Dec. 4, 2008

(30) Foreign Application Priority Data

May 30, 2007  (KR) .......................... 10-2007-052453
Jan. 25, 2008  (KR) .......................... 10-2008-007983

(51) Int. Cl.
*G02F 1/136* (2006.01)
*G02F 1/1335* (2006.01)

(52) U.S. Cl. ............................ 349/43; 349/106; 349/138
(58) Field of Classification Search .................. 349/43, 349/106, 141, 138, 139, 152, 187; 438/158; 257/E21.7
See application file for complete search history.

(56) References Cited

U.S. PATENT DOCUMENTS 6,697,138 B2 *  2/2004  Ha et al. ........................ 349/114
7,133,105 B2 * 11/2006  Kim et al. ..................... 349/149

* cited by examiner

*Primary Examiner* — Thoi Duong
(74) *Attorney, Agent, or Firm* — Cantor Colburn LLP

(57) ABSTRACT

A display substrate that has increased aperture ratio is presented. The display substrate includes a base substrate, a first metal pattern formed on the base substrate and a gate wiring and a gate electrode. A first insulating layer is formed on the base substrate covering the first metal pattern. A second metal pattern is formed on the first insulating layer including a data wiring crossing the gate wiring, a source electrode connected to the data wiring and a drain electrode separated from the source electrode. A second insulating layer is formed on the base substrate covering the second metal pattern. A transparent electrode is formed on the second insulating layer. An organic layer is formed on the transparent electrode, and a pixel electrode is formed on the organic layer being insulated with the transparent electrode, and contacted to the drain electrode. The organic layer may comprise red, green and blue color filters.

25 Claims, 22 Drawing Sheets

DISPLAY SUBSTRATE, METHOD OF MANUFACTURING THE SAME AND DISPLAY DEVICE USING THE DISPLAY SUBSTRATE

CROSS-REFERENCE TO RELATED APPLICATIONS

This application claims priority to Korean Patent Application No. 2007-0052453 filed on May 30, 2007 and Korean Patent Application No. 2008-0007983 filed on Jan. 25, 2008 the contents of which are herein incorporated by reference in their entireties.

BACKGROUND OF THE INVENTION

1. Technical Field

The present invention relates to a display substrate, a method of manufacturing the same and a display apparatus having the same, and more particularly, a display substrate for displaying an image, a method of manufacturing the same and a display apparatus having the same.

2. Discussion of the Related Art

A liquid crystal display device which is a display device for displaying images includes a display substrate, a counter substrate disposed opposite the display substrate, and a liquid crystal layer disposed between the two substrates.

Generally, a display substrate includes gate wirings, data wirings, storage wirings, thin film transistors and pixel electrodes that are formed on the transparent substrate to drive a plurality of pixels independently. The counter substrate includes a color filter layer having red, green and blue color filters, a black matrix disposed on the boundary portion of the color filters, and a common electrode opposite the pixel electrode.

Recently, a structure that can prevent light leakage and increase the aperture ratio by making a part of the storage wiring that is formed with the gate wiring overlap the data wiring has been introduced.

However, a display substrate having such a structure can not increase the aperture ratio sufficiently and has a problem because of a longitudinal spot generated by a parasitic capacitance between the pixel electrodes and the data wirings.

SUMMARY OF THE INVENTION

Embodiments of the present invention provide a display substrate capable of increasing the aperture ratio and improving display quality.

An embodiment of the present invention provides a method of manufacturing the display substrate.

Another embodiment of the present invention provides a display device having the display substrate.

The present invention discloses a display substrate having a base substrate, a first metal pattern, a first insulating layer, a second metal pattern, a second insulating layer, a transparent electrode, an organic layer, a pixel electrode. The first metal pattern is formed on the base substrate, and includes a gate wiring and a gate electrode connected to the gate wiring. The first insulating layer is formed on the base substrate on which the first metal pattern is formed covering the first metal pattern. The second metal pattern is formed on the first insulating layer, and includes a data wiring crossing the gate wiring, a source electrode connected to the data wiring and a drain electrode separated from the source electrode. The second insulating layer is formed on the base substrate on which the second metal pattern is formed, and covering the second metal pattern. The transparent electrode is formed on the second insulating layer. The organic layer is formed on the transparent electrode. The pixel electrode is on the organic layer being insulated with the transparent electrode, and is in contact with the drain electrode.

The organic layer may comprise red, green and blue color filters, and at least two of the red, green and blue color filters may overlap with each other on the data wiring.

A first contact hole that exposes at least a part of the drain electrode is formed in the second insulating layer and the transparent electrode respectively, and a second contact hole that exposes at least a part of the drain electrode inside of the first contact hole is formed in the organic layer. The organic layer covers the etched section corresponding to the first contact hole of the second insulating layer and the transparent electrode.

The display substrate further comprises an active pattern formed between the first insulating layer and the second metal pattern, and the transparent electrode may cover at least the gate wiring, the data wiring and the active pattern.

The present invention also discloses a method of manufacturing a display substrate. The method includes forming a first metal pattern including a gate wiring and a gate electrode connected to the gate wiring on a base substrate. A first insulating layer that covers the first metal pattern is formed on the base substrate on which the first metal pattern is formed. An active pattern is formed on the first insulating layer. A second metal pattern including a data wiring crossing the gate wiring, a source electrode connected to the data wiring and a drain electrode separated from the source electrode is formed on the base substrate on which the active pattern is formed. A second insulating layer that covers the second metal pattern is formed on the base substrate on which the second metal pattern is formed. A transparent electrode is formed on the second insulating layer. An organic layer is formed on the transparent electrode. And a pixel electrode insulated with the transparent electrode and contacted to the drain electrode is formed on the organic layer.

The present invention also discloses a method of manufacturing the display substrate that includes forming a first metal pattern including a gate wiring and a data wiring connected to the gate wiring, on a base substrate. A first insulating layer, an active layer and a metal layer are formed in order on the base substrate on which the first metal pattern is formed. A second metal pattern including a data wiring, a source electrode and a drain electrode connected to the data wiring, and an active pattern disposed between the second metal pattern and the first insulating layer are formed by patterning the metal layer and the active layer in a single mask process. A second insulating layer covering the second metal pattern is formed on the base substrate on which the second metal pattern is formed. A transparent electrode is formed on the second insulating layer. An organic layer is formed on the transparent electrode. And a pixel electrode insulated with the transparent electrode and contacted to the drain electrode is formed on the organic layer.

The present invention also discloses a display device that includes a display substrate, a counter substrate opposing to the display substrate, and a liquid crystal layer disposed between the display substrate and the opposing substrate. The display substrate comprises a first metal pattern, a first insulating layer, a second metal pattern, a second insulating layer, a transparent electrode, an organic layer, and a pixel electrode.

The first metal pattern including a gate wiring and a gate electrode is formed on the base substrate. The first insulating layer covering the first metal pattern is formed on the base substrate on which the first metal pattern is formed. The second metal pattern including a data wiring crossing the gate wiring, a source electrode connected to the data wiring and a drain electrode separated from the source electrode is formed on the first insulating layer on which the active layer is formed. The second insulating layer covering the second metal pattern is formed on the base substrate. The transparent electrode is formed on the second insulating layer. The organic layer is formed on the transparent electrode. A pixel electrode being insulated with the transparent electrode and contacted to the drain electrode is formed on the organic layer.

The organic layer may include red, green and blue color filters, and at least two of the red, green and blue color filters may overlap with each other on the data wiring.

A first contact hole that exposes at least a part of the drain electrode is formed in the second insulating layer and the transparent electrode respectively, and a second contact hole that exposes at least a part of the drain electrode inside of the first contact hole is formed in the organic layer. The organic layer covers the etched section corresponding to the first contact hole of the second insulating layer and the transparent electrode.

The display device further includes an active pattern formed between the first insulating layer and the second metal pattern, and the transparent electrode may cover at least the gate wiring, the data wiring and the active pattern.

BRIEF DESCRIPTION OF THE DRAWINGS

The above and other features of the present disclosure will become more apparent by describing exemplary embodiments thereof with reference to the accompanying drawings, in which.

DETAILED DESCRIPTION OF THE EXEMPLARY EMBODIMENTS

Figure 1:
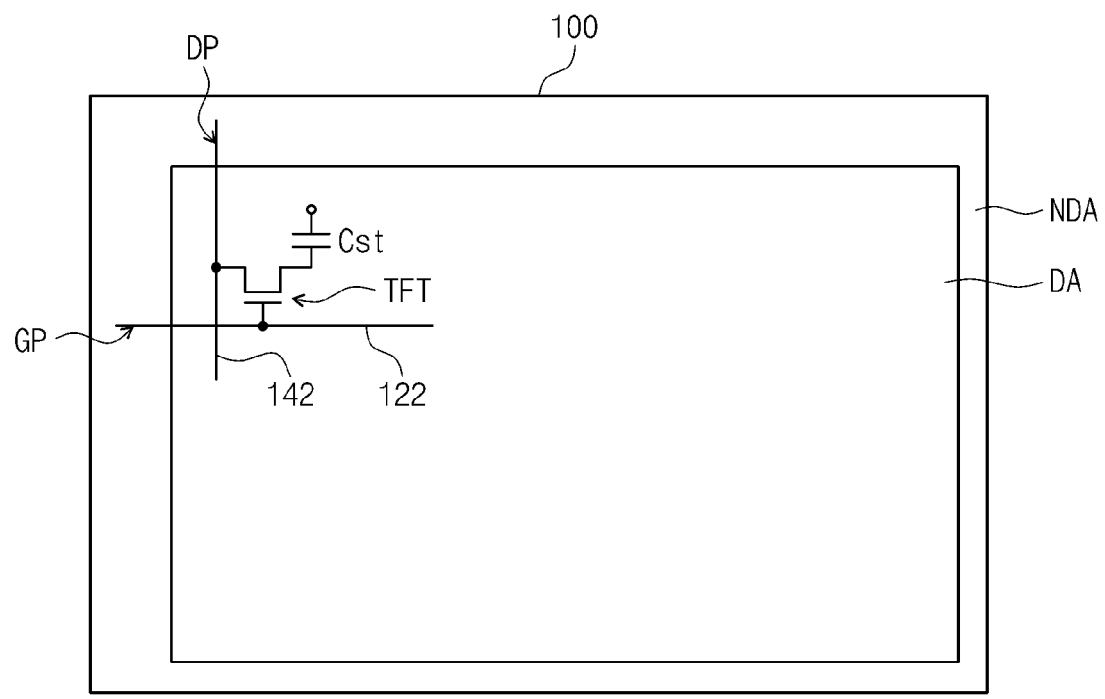
FIG. 1 is a plan view roughly showing a display substrate according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

FIG. 1 is a plan view roughly showing a display substrate according to a first exemplary embodiment of the present invention.

Referring to FIG. 1, a display substrate (100) according to the present invention includes a display area (DA) that shows images and a non-display area (NDA) outside the display area (DA).

A plurality of gate wirings (122), data wirings (142), thin film transistors (TFT) and storage capacitors (Cst) are formed in the display area (DA). A plurality of gate pad portions (GP) connected to the gate wirings (122) and data pad portions (DP) connected to the data wirings (142) are formed in the non-display area (NDA).

Figure 2:
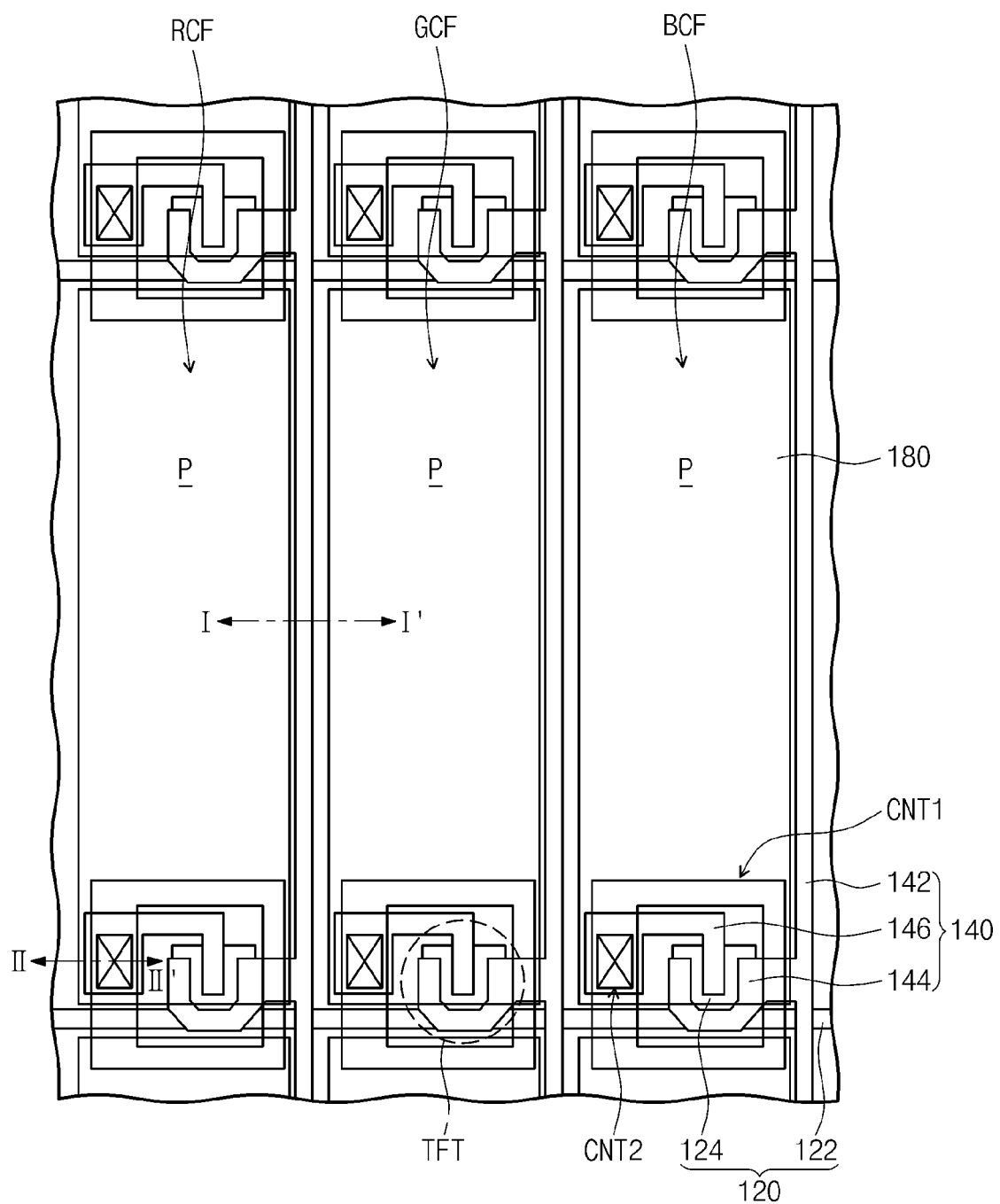
FIG. 2 is an enlarged view showing a display area shown in FIG. 1.
Figure 3:
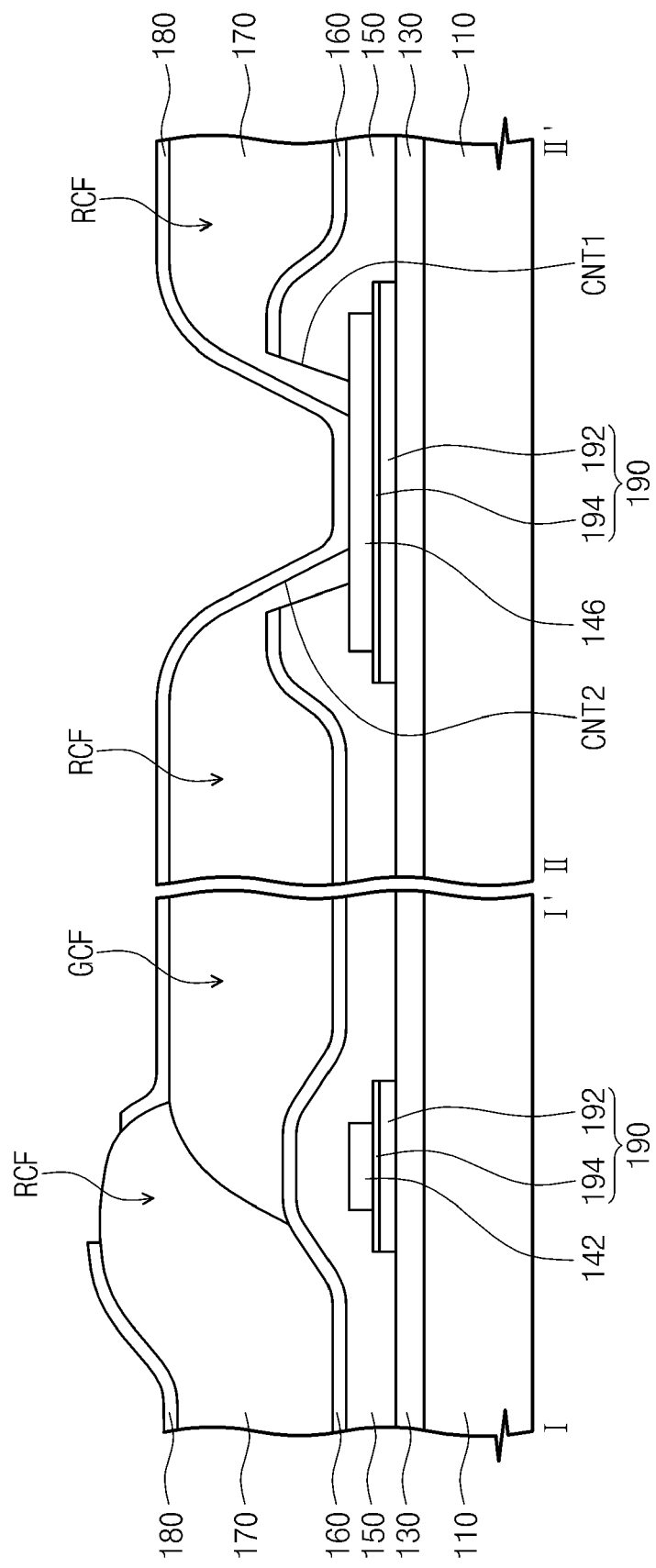
FIG. 3 is a cross sectional view taken along lines ☐-☐' and ☐-☐' of FIG. 2.

FIG. 2 is an enlarged view showing a display area shown in FIG. 1 and FIG. 3 is a cross sectional view taken along lines I-I' and II-II' of FIG. 2.

Referring to FIGS. 2 and 3, the display substrate (100) comprises a first metal pattern (120), a first insulating layer (130), a second metal pattern (140), a second insulating layer (150), a transparent electrode (160), an organic layer (170) and a pixel electrode (180), which are formed in order on the base substrate (110). The base substrate (110) may be made of, for example, transparent glass or plastic.

The first metal pattern (120) is formed on the base substrate (110). The first metal pattern may include a gate wiring (122) and a gate electrode (124) connected to the gate wiring (122).

The gate wiring (122) may be extended, for example, in a horizontal direction. The gate electrode (124) forms a gate terminal of the thin film transistor (TFT).

The first metal pattern (120) may be formed as, for example, a Mo/Al double layer so that an aluminum (Al) layer and molybdenum (Mo) layer are laminated sequentially. Or, the first metal pattern (120) may be formed as a single layer or multiple layer including metal or alloy of at least one of Aluminum (Al), Molybdenum (Mo), Neodymium (Nd), Chrome (Cr), Tantalum (Ta), Titanium (Ti), Tungsten (W), Copper (Cu) or Silver (Ag).

The first insulating layer (130) is formed on the base substrate (110) on which the first metal pattern (120) is formed, covering the first metal pattern (120). The first insulating layer (130) insulates and protects the first metal pattern (120), and is made from Silicon Nitride (SiNx) or Silicon Oxide (SiOx). The thickness of the first insulating layer (130) may be 1500 Å~2500 Å.

The second metal pattern (140) is formed on the first insulating layer (130). The second metal pattern (140) may comprise a data wiring (142), a source electrode (144) connected to the data wiring (142) and a drain electrode (146) separated from the source electrode (144). The data wiring (142) is insulated with the gate wiring (122) by the first insulating layer (130), and is extended in a direction crossing the gate wiring (122). For example, the data wiring (142) may be formed in a longitudinal direction so as to cross at right angles to the gate wiring (122). The source electrode (144) is extended from the data wiring (142) so that at least a part of the source electrode (144) overlaps the gate electrode (124). The source electrode (144) forms a source terminal of the thin film transistor (TFT). The drain electrode (146) is separated from the source electrode (144) by a certain gap, and at least a part of the drain electrode (146) overlaps the gate electrode (124). The drain electrode (146) forms the drain terminal of the thin film transistor (TFT).

The second metal pattern (140) may be formed as a triple layer of Mo/Al/Mo. In one embodiment of the invention this is done sequentially by forming a lower molybdenum (Mo) layer, an aluminum (Al) layer and an upper molybdenum (Mo) layer. Or, the second metal pattern (140) may be formed as a single layer or multiple layer including a metal or alloy of at least one of Aluminum (Al), Molybdenum (Mo), Neodymium (Nd), Chrome (Cr), Tantalum (Ta), Titanium (Ti), Tungsten (W), Copper (Cu) or Silver (Ag).

The display substrate (100) may further include an active pattern (190) that is formed between the first insulating layer (130) and the second metal pattern (140) in order to form a thin film transistor (TFT). The active pattern (190) and the second metal pattern (140) may be formed in a single mask process in order to reduce the number of mask processes. When forming the active pattern (190) and the second metal pattern (140) in a single mask process, the active pattern (190) has substantially same shape as the second metal pattern (140), and may be disposed between the first insulating layer (130) and the second metal pattern (140).

On the other hand, in the event a different mask is used for forming the active pattern (190) and the second metal pattern (140), the active pattern (190) may be formed only at a portion where the active pattern (190) overlaps the gate electrode (124).

The active pattern (190) may comprise a semi conductor layer (192) and an ohmic contact layer (194). The semi conductor layer (192) performs the role of a channel through which current flows, and the ohmic contact layer (194) reduces contact resistance between the semi conductor layer (192) and the source and drain electrodes (144, 146). For example, the semi conductor layer (192) is made from amorphous silicon (a-Si), and the ohmic contact layer (194) is made from amorphous silicon heavily doped with n+ dopant.

According to the above, thin film transistors (TFT), each of which comprises the gate electrode (124), the active pattern (190), the source electrode (144) and the drain electrode (146) are formed in each pixel (p) of the display substrate (100). At least one thin film transistor (TFT) is formed in each pixel (P) in order to drive each pixel (P). The thin film transistor (TFT) applies a pixel voltage that is applied from the data wiring (142) in response to the scan signal applied from the gate wiring (122).

The second insulating layer (150) is formed on the base substrate (110) on which the second metal pattern (140) is formed, covering the second metal pattern (140). The second insulating layer insulates and protects the second metal pattern (140) and is made, for example, from silicon nitride (SiNx) or silicon oxide (SiOx). The second insulating layer (150) may be formed to have a thickness of 3500 Å~4500 Å.

The transparent electrode (160) is formed on the second insulating layer (150). The transparent electrode (160) is located opposite the pixel electrode (180) with the organic layer therebetween forming a storage capacitor (Cst). The pixel voltage applied to the pixel electrode (180) by the thin film transistor (TFT) is maintained for one frame due to the storage capacitor (Cst). Here, a direct current voltage is applied to the transparent electrode (160). For example, a common voltage (Vcom), that is a direct current voltage equivalent to the middle of the swinging pixel voltage, is applied to the transparent electrode (160).

The transparent electrode (160) is made from a transparent conductive material through which light can be transmitted. For example, the transparent electrode (160) may be made from indium tin oxide (ITO) or indium zinc oxide (IZO). The transparent electrode (160) may have a thickness of about 500 Å~600 Å.

A first contact hole (CNT1) that exposes at least a part of the drain electrode (146) is formed in the second insulating layer (150) and the transparent electrode (160) for electrical contact between the drain electrode (146) and the pixel electrode (180). For example, the first contact hole (CNT1) may be formed to surround the thin film transistor (TFT) portion. In this case, the transparent electrode (160) disposed on the thin film transistor (TFT) is floated and the DC voltage is not applied thereto.

The organic layer is formed on the transparent electrode (160). By forming the organic layer (170), the display substrate (100) can be flattened. The organic layer (170) may have a thickness of about 2.5 μm~3.5 μm.

The organic layer (170) may comprise red, green and blue color filters (RCF, GCF, BCF). The red, green and blue color filters (RCF, GCF, BCF) are arranged in order according to each pixel (P). Preferably, at least two of the red, green and blue color filters (RCF, GCF, BCF) are formed to overlap with each other on the data wiring (142). According to the above structure of the red, green and blue color filters (RCF, GCF, BCF), light leakage near the data wiring (142) can be prevented and the width of a black matrix formed on a counter substrate can be reduced as narrow as that of the data wiring (142) which results in the increase of the aperture ratio.

A second contact hole (CNT2) that exposes at least a part of the drain electrode (146) is formed on the organic layer (170) for electrical contact between the drain electrode (146) and the pixel electrode (180). The second contact hole (CNT2) is formed inside the first contact hole (CNT1).

The organic layer (170) covers the etched section corresponding to the first contact hole (CNT1) of the second insulating layer (150) and the transparent electrode (160), respectively. Accordingly, the organic layer (170) prevents the transparent electrode (160) and the pixel electrode (180) from being shorted with each other in the first contact hole (CNT1) area.

The pixel electrode (180) is formed on the organic layer (170) according to each pixel (P) being insulated with the transparent electrode (160). The pixel electrode (180) is made from transparent conductive material through which light can be transmitted. For example, the pixel electrode (180) may be made from indium tin oxide (ITO) or indium zinc oxide (IZO).

The pixel electrode (180) is electrically connected to the drain electrode (146) through the second contact hole (CNT2) formed in the organic layer (170). Accordingly, once the scan signal is applied to the gate electrode (124) of the thin film transistor (TFT) through the gate wiring (122), the thin film transistor (TFT) is turned on and the pixel voltage that was applied to the source electrode (144) of the thin film transistor (TFT) through the data wiring (142) is applied to the pixel electrode (180) through the drain electrode (146).

The pixel electrode fully overlaps the transparent electrode (160) to form the storage capacitor (Cst). The pixel voltage applied to the pixel electrode (180) by drive of the thin film transistor (TFT) is maintained for one frame.

The edge of the pixel electrode (180) may overlap the data wiring (142).

The pixel electrode (180) may have a certain opening pattern to divide each pixel (P) into a number of domains for realization of a broad viewing angle.

Figure 4:
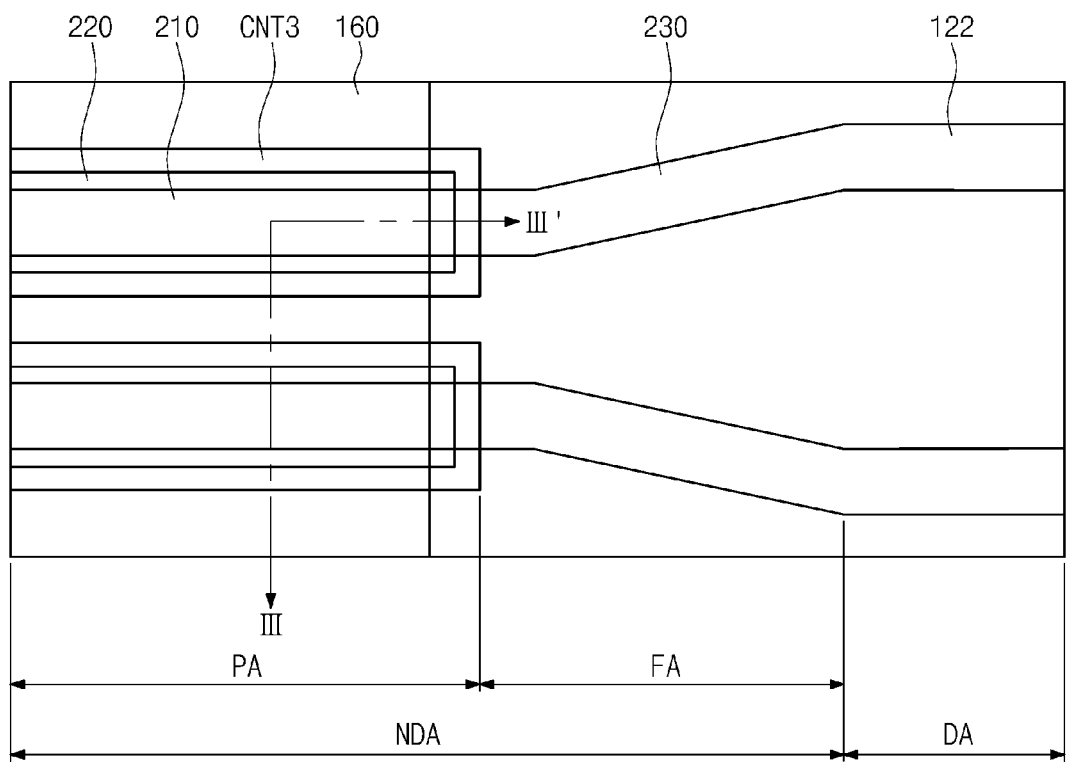
FIG. 4 is an enlarged view of gate pad shown in FIG. 1.
Figure 5:
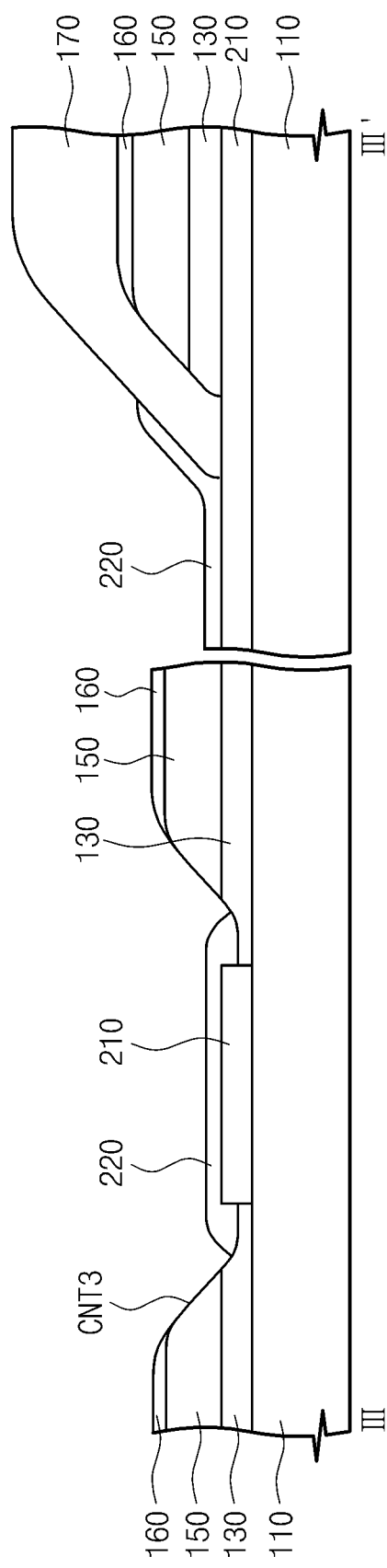
FIG. 5 is a cross sectional view taken along line ☐-☐' of FIG. 4.

FIG. 4 is an enlarged view of gate pad shown in FIG. 1 and FIG. 5 is a cross sectional view taken along line III-III' of FIG. 4

Referring to FIGS. 1, 4 and 5, the non-display area (NDA) of the display substrate (100) includes pad area (PA) and fan out area (FA) disposed between the pad area (PA) and the display area (DA). In the pad area (PA), gate pads (GP) and data pads (DP) are formed. In the fan out area (FA), fan out lines (230) that connect the gate wiring (122) and the gate pad (GP) and connect the data wiring (142) and the data pad (DP) are formed.

The gate pad (GP) includes a gate metal pad (210) and a gate transparent pad (220).

The gate metal pad (210) is connected to the gate wiring (122), and formed in the pad area (PA) in the non-display area (NDA) disposed outside the display area (DA). The gate metal pad (210) is formed on the base substrate (110) with the same material as the first metal pattern (120), and formed together with the first metal pattern (120).

The gate transparent pad (220) is formed on the gate metal pad (210) and in direct contact with the gate metal pad (210). The gate transparent (220) is formed to have a wider width so that the gate metal pad (210) covers both ends in the direction of the gate metal pad (210). The gate transparent pad (220) is made from the same material as the pixel electrode (190), and formed together with the pixel electrode (190).

A third contact hole (CNT3) exposes the gate metal pad (210) and is formed in the first insulating layer (130), the second insulating layer (220) and the transparent electrode (160) for connection of the gate metal pad (210) and the gate transparent pad (220).

The transparent electrode (160) and the gate transparent pad (220) include a conductive material. The third contact hole (CNT3) is formed to have a wider width than the gate transparent pad (220) in order to prevent contact of the transparent electrode (220) and the gate transparent pad (220).

The organic layer (170) extends from the display area (DA) to an end portion of the pad area (PA) next to the fan out area (FA). The organic layer (170) covers the etched section of the third contact hole (CNT3) next to the fan out area (FA). Thus, one end portion in the longitudinal direction of the gate transparent pad (220) next to the fan out area (FA) can be insulated with the transparent electrode (160) by the organic layer (170).

The data pad (DP) is formed to have substantially the same structure as the gate pad (GP) except that a data metal pad and a data transparent pad are formed on the first insulating layer (130), and therefore, detailed description about the data pad (DP) will be omitted.

A short between the transparent electrode (160) and the gate transparent pad (220) and the data transparent pad can be prevented by removing the transparent electrode (160) and the second insulating layer (150) of the pad area (PA) in which the gate pad (GP) and the data pad (DP) are formed.

By using the transparent electrode (160) for the electrode that forms storage capacitor (Cst) opposing the pixel electrode (180), the aperture ratio can be increased to a maximum.

And, by overlapping the same area of the pixel electrode (180) and the transparent electrode (160) with the organic layer (170) therebetween, capacitance of the storage capacitor (Cst) can be increased, which results in minimization of flicker and kick-back.

Moreover, by disposing the transparent electrode to which the direct current voltage is applied between the pixel electrode (180) and the data wiring (142), the parasitic capacitance generated between the pixel electrode (180) and the data wiring (142) can be minimized, and due to the above, inferiority like a longitudinal spot generated from the declination of capacitance by miss-alignment between the pixel electrode (180) and the data wiring (142) can be prevented.

By disposing the transparent electrode (160) on the data wiring (142), the parasitic capacitance between the data wiring (142) and the common electrode of the counter substrate and the pixel electrode (180) can be minimized and the load applied to the data wiring (142) can be reduced, which results in the reduction of the delay of the pixel voltage flowing through the data wiring (142).

By disposing the transparent electrode (160) on the data wiring (142), the coupling between the data wiring (143) to which the swing pixel voltage is applied and the common electrode of the counter substrate to which the common voltage (Vcom) is applied can be prevented.

Hereinafter, a second exemplary embodiment of the display substrate according to the present invention will be described with reference to FIGS. 6 and 7. In the present embodiment, a description may be omitted or abbreviated for elements that are substantially the same as in the first embodiment, and the description will focus on the differences between embodiments.

Figure 6:
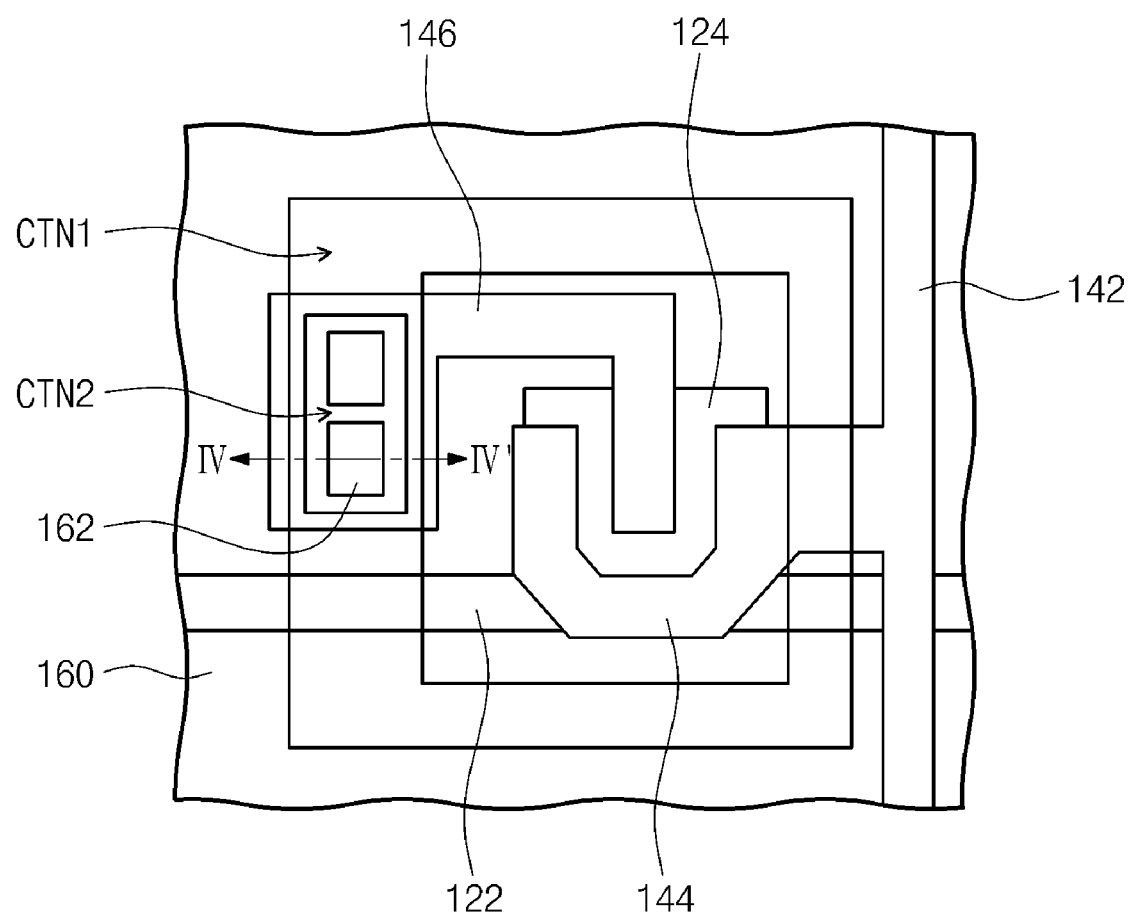
FIG. 6 is an enlarged view showing a display substrate according to a second exemplary embodiment of the present invention.
Figure 7:
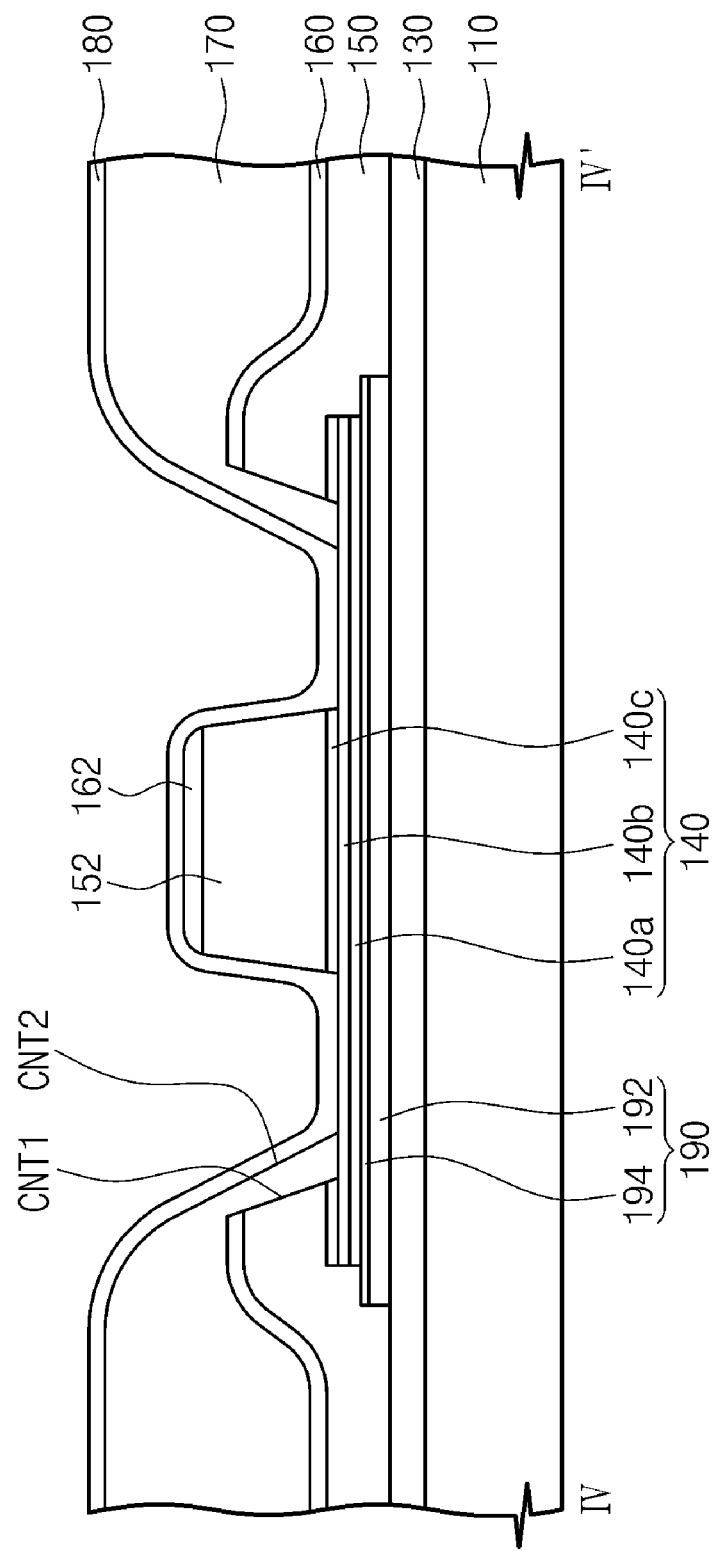
FIG. 7 is a cross sectional view taken along line ☐-☐' of FIG. 6.

FIG. 6 is an enlarged view showing a display substrate according to a second exemplary embodiment of the present invention and FIG. 7 is a cross sectional view taken along line IV-IV' of FIG. 6.

Referring to FIGS. 6 and 7, the display substrate (100) may further comprise a dummy insulating layer (152) and a dummy transparent electrode (162).

At least one of the dummy insulating layer (152) is formed on the drain electrode (146) exposed by the second contact hole (CNT2). The dummy insulating layer (152) is formed as an island shape so as to be separated from the organic layer (170). The dummy insulating layer (152) may be formed together with the second insulating layer (150), with the same material as the second insulating layer (150).

As explained above, the second metal pattern (140) including the drain electrode (146) includes lower molybdenum layer (140a), aluminum layer (140b) and upper molybdenum layer (140c) that are formed in order from the first insulating layer (130).

The upper molybdenum layer (140c) is formed in the area in which the dummy insulating layer (152) is formed, but is not formed in any other area inside the first contact hole (CNT1). Thus, the pixel electrode (180) contacts with the side of the upper molybdenum layer (140c) remaining under the dummy insulating layer (152), and the contact reliability between the drain electrode (146) and the pixel electrode (180) is improved. The upper molybdenum layer (140c) may be removed by overetching when the second insulating layer (150) is dry-etched to form the first contact hole (CNT1).

Hereinafter, a third exemplary embodiment of the display substrate according to the present invention will be described with reference to FIGS. 8 and 9. In the present embodiment, a description may be omitted or abbreviated for elements that are substantially the same as in the first embodiment and the second embodiment, and the description will focus on the differences between embodiments.

Figure 8:
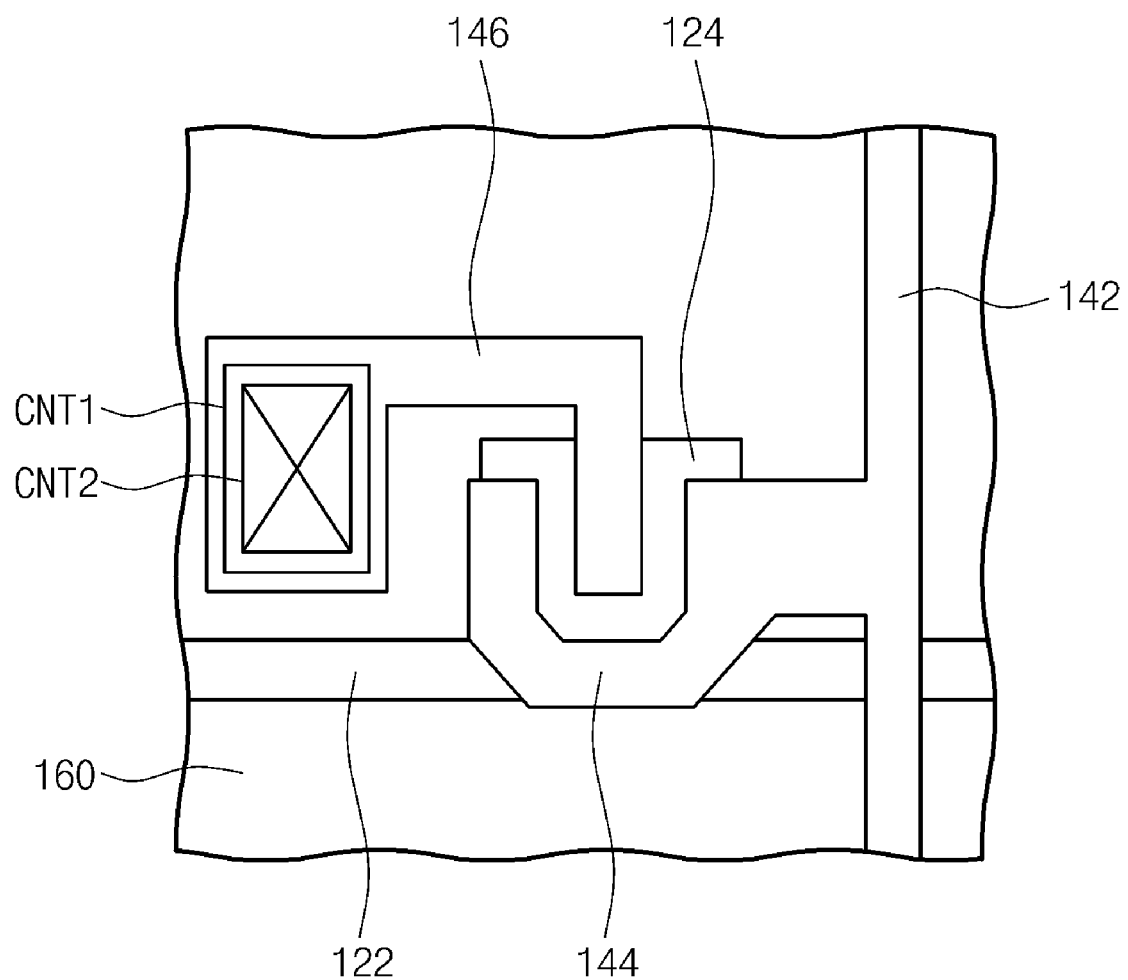
FIG. 8 is an enlarged view showing a display substrate according to a third exemplary embodiment of the present invention.
Figure 9:
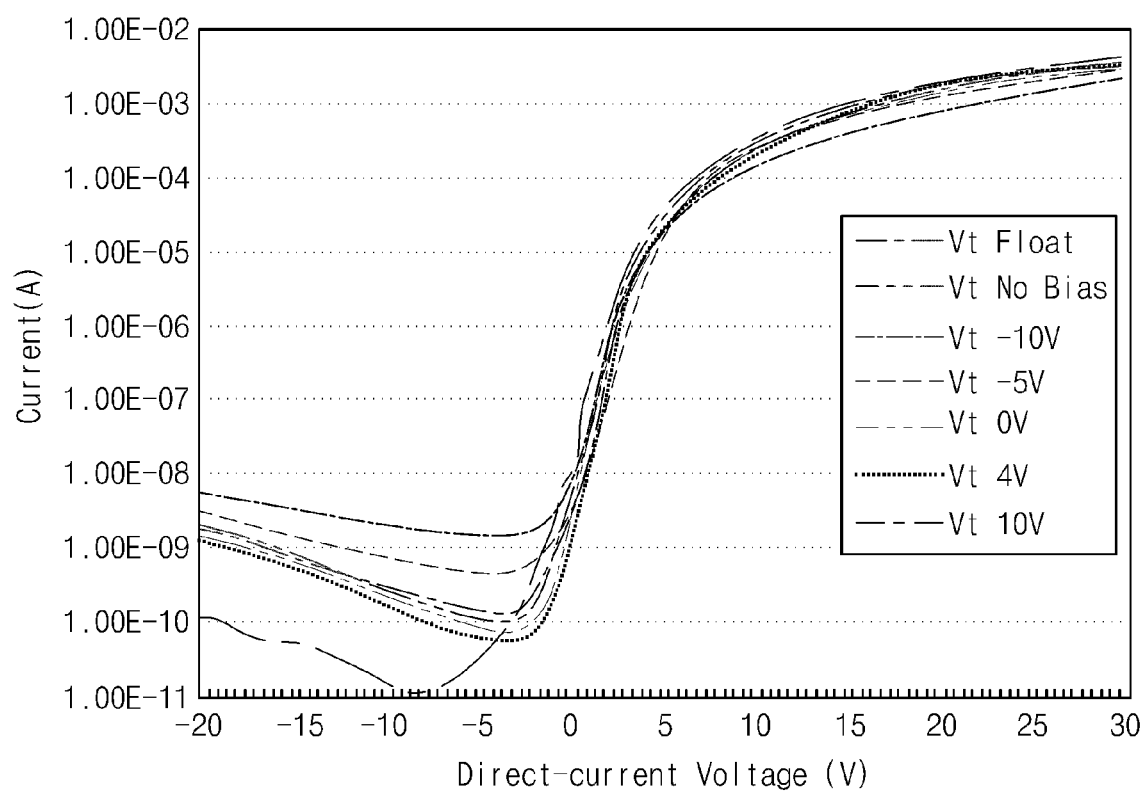
FIG. 9 is a graph showing a transfer curve when a direct-current voltage is applied to the transparent electrode of the present invention.

FIG. 8 is an enlarged view showing a display substrate according to a third exemplary embodiment of the present invention. FIG. 9 is a graph showing a transfer curve when a direct-current voltage is applied to the transparent electrode of the present invention.

Referring to FIGS. 8, the transparent electrode (160) covers the entire area of each pixel (P) defined on the base substrate (110) other than the area corresponding to the first contact hole (CNT1), and the first contact hole (CNT1) is formed to expose only a part of the drain electrode (146). Namely, the transparent electrode (160) covers the entire area of each pixel (P) except that area corresponding to a part of the drain electrode (146).

By forming the transparent electrode (160) and the first contact hole (CNT1) as described above, the gate wiring (122) and the data wiring (142) can be prevented from being damaged during the dry etching process for the second insulating layer (150).

Meanwhile, as described in the first embodiment, DC voltage is applied to the transparent electrode (160). However, unlike the first embodiment, the DC voltage can be applied to the transparent electrode (160) on the active area because the transparent electrode (160) is formed continuously on the pixel (P) except on the area corresponding to a part of the drain electrode (146). Due to the above structure, the threshold voltage (Vth) can be controlled by changing the DC voltage applied to the transparent electrode (160) as described in FIG. 9. Namely, the threshold voltage (Vth) decreases while increasing the DC voltage applied to the transparent electrode (160). Here, as the DC voltage is increased, the accumulation of electrons at the active layer (190) is also increased, and that results in the decrease of the threshold voltage (Vth).

Hereinafter, a method of manufacturing the display substrate according to the exemplary embodiment of the present invention will be described.

FIGS. 10 to 17 are plan views or sectional views showing a method of manufacturing a display substrate shown in FIGS. 2 and 3.

Figure 10:
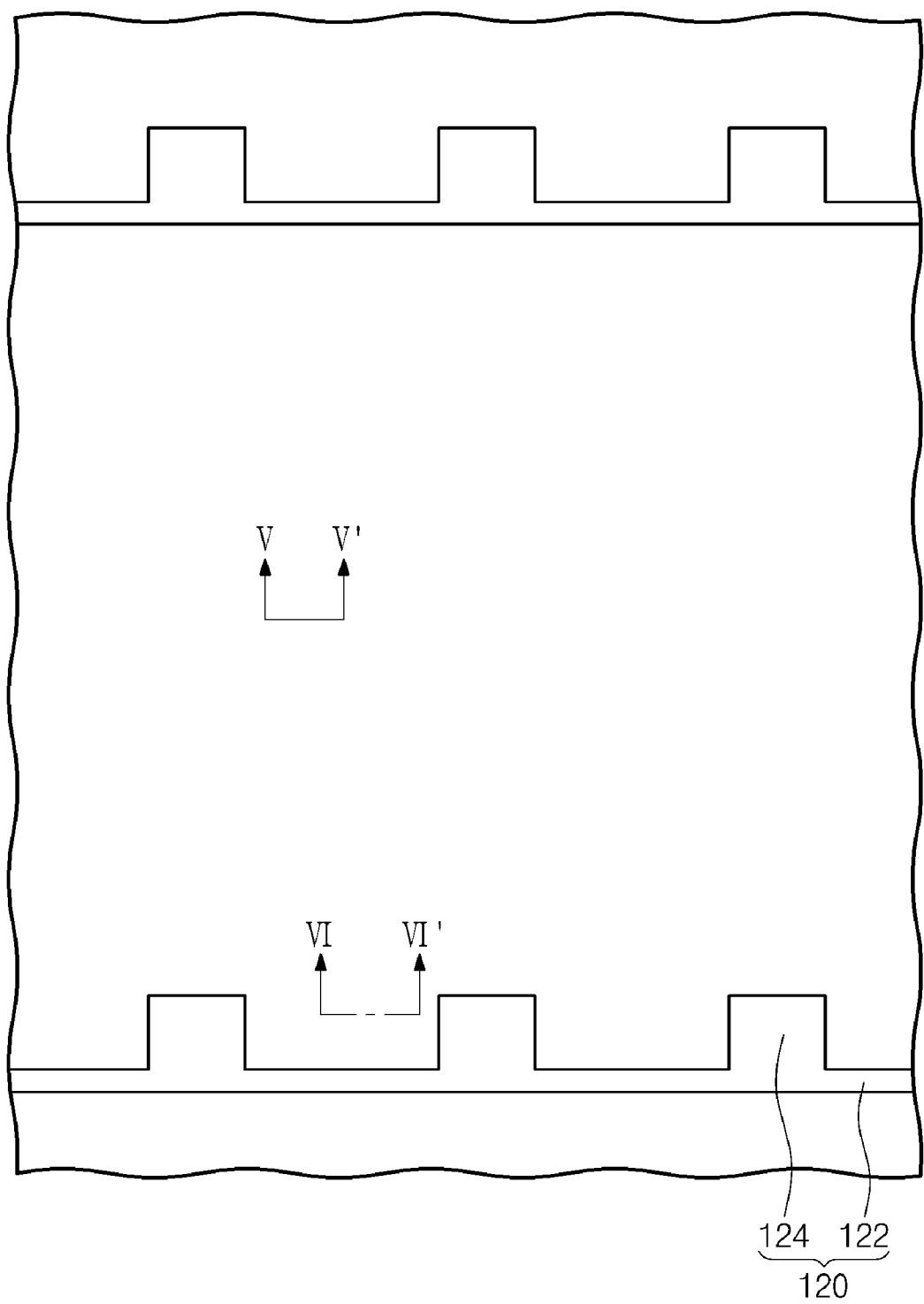
FIGS. 10 to 17 are plan views or sectional views showing a method of manufacturing a display substrate shown in FIGS. 2 and 3.
Figure 11:
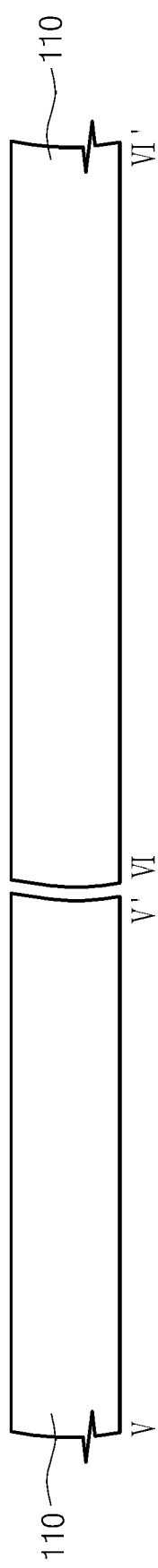

Referring to FIGS. 10 and 11, a first metal pattern (120) is formed in the base substrate (110). The first metal pattern (120) comprises a gate wiring (122) and a gate electrode (124) connected to the gate wiring (122).

The first metal pattern (120) is formed to have, for example, a Mo/Al double layer such that the aluminum layer (Al) and molybdenum layer (Mo) are laminated sequentially. Or, the first metal pattern (120) may be formed as a single layer or multiple layer including a metal or alloy of at least one of Aluminum (Al), Molybdenum (Mo), Neodymium (Nd), Chrome (Cr), Tantalum (Ta), Titanium (Ti), Tungsten (W), Copper (Cu) or Silver (Ag).

Figure 12:
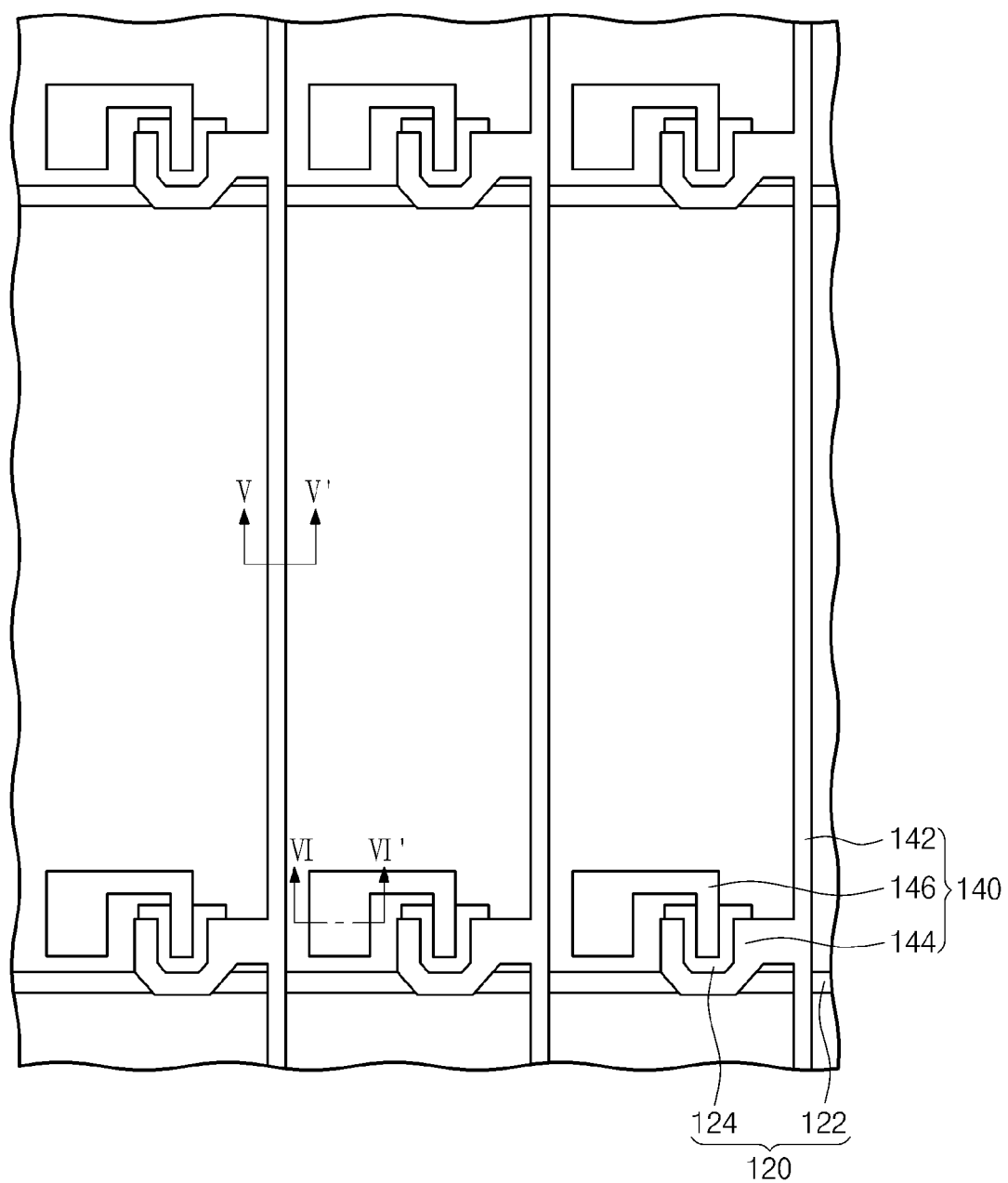
Figure 13:
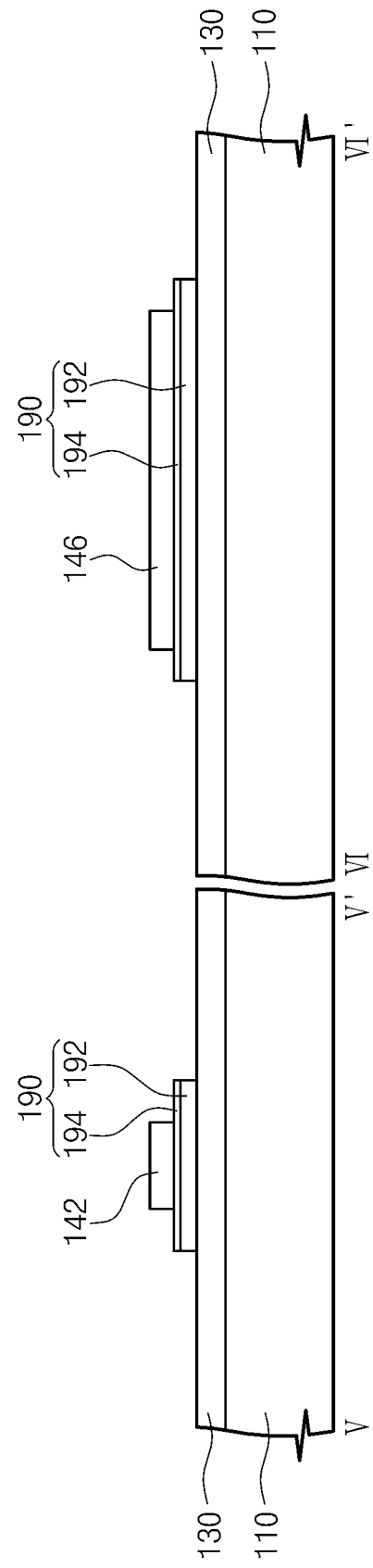

Referring to FIGS. 12 and 13, a first insulating layer (130) is formed on the base substrate (110) on which the first metal pattern (120) is formed to cover the first metal pattern (120). For example, the first insulating layer (130) is made from silicon nitride (SiNx) or silicon oxide (SiOx), and formed to have a thickness of about 1500 Å~2500 Å.

An active pattern (190) and a second metal pattern (140) are formed on the first insulating layer (130). The active pattern (190) and the second metal pattern (140) may be patterned respectively in a two mask process using different masks, respectively, or in a single mask process using one mask. For example, when patterning the active pattern (190) and the second metal pattern (140) respectively using the two step mask process, the active pattern (190) may be formed only in the area that overlaps the gate electrode (124). On the other hand, when patterning the active pattern (190) and the second metal pattern (140) in a single mask process, the active pattern (190) is formed to have substantially the same figure as the second metal pattern (140). That is, the active pattern (190) is formed between the first insulating layer (130) and the second metal pattern (140).

The active pattern (190) may include a semi conductor layer (192) and a ohmic contact layer (194). For example, the semi conductor layer (192) is made from amorphous silicon (a-Si), and the ohmic contact layer (194) is made from amorphous silicon heavily doped with n+ dopant.

The second metal pattern (140) comprises a data wiring (142) crossing the gate wiring (122), a source electrode (144) connected to the data wiring (142) and a drain electrode (146) separated from the source electrode (144).

The second metal pattern (140) may be formed as, for example, a Mo/Al/Mo triple layer so that a lower molybdenum (Mo) layer, an aluminum (Al) layer and an upper molybdenum (Mo) layer are laminated sequentially. Or, the second metal pattern (140) may be formed as a single layer or multiple layer including a metal or alloy of at least one of Aluminum (Al), Molybdenum (Mo), Neodymium (Nd), Chrome (Cr), Tantalum (Ta), Titanium (Ti), Tungsten (W), Copper (Cu) or Silver (Ag).

The ohmic contact layer (194) of the channel area that is between the source electrode (144) and the drain electrode (146) is removed for forming the thin film transistor (TFT).

Figure 14:
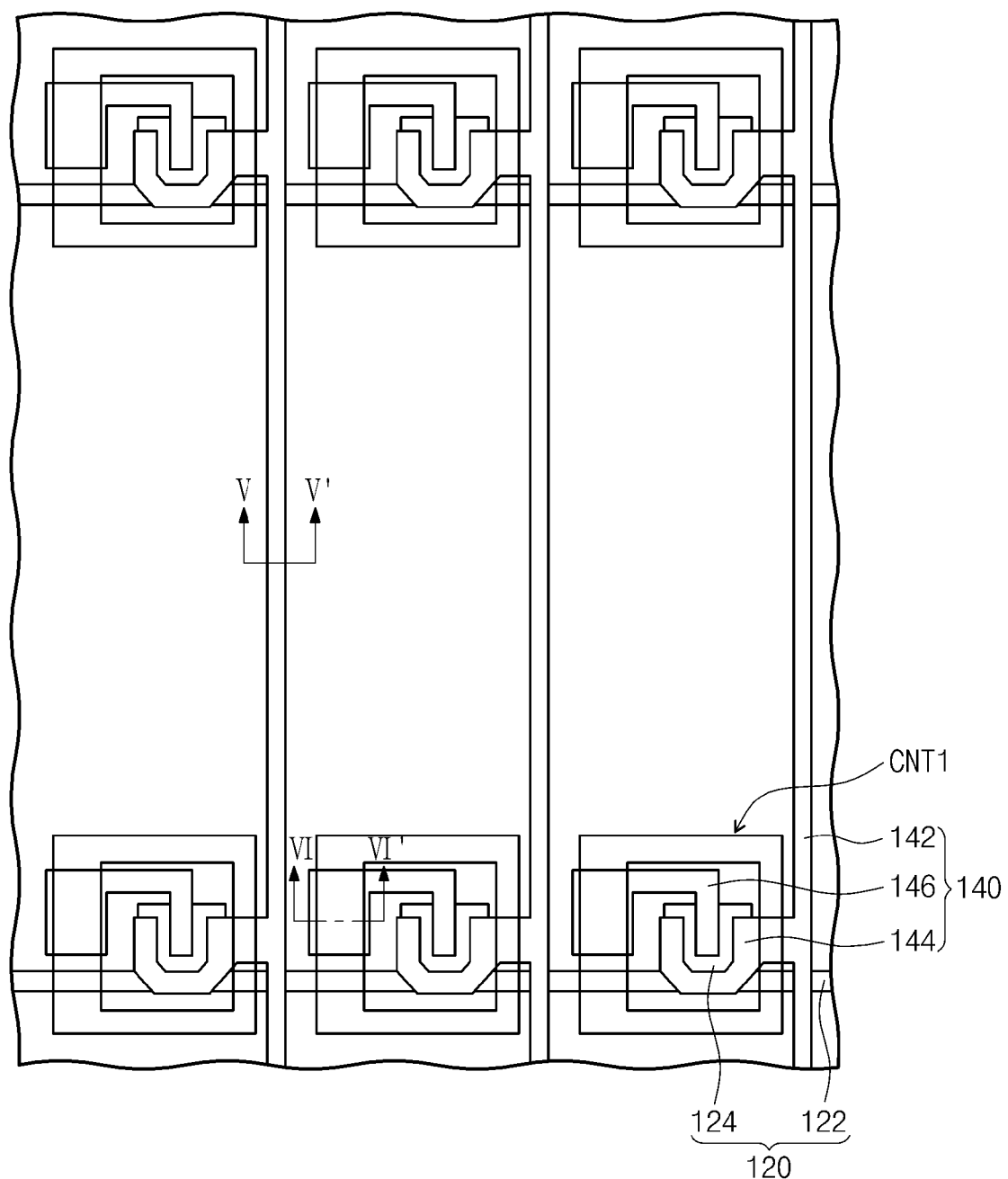
Figure 15:
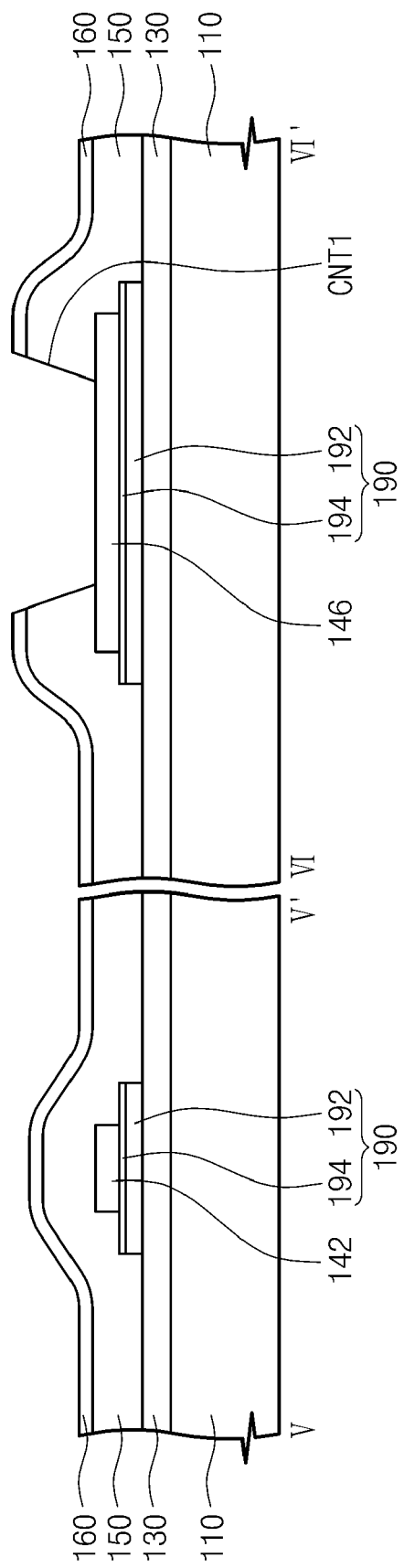

Referring to FIGS. 14 and 15, a second insulating layer (150) and a transparent electrode (160) are formed on the base substrate (110) on which the second metal pattern (140) is formed to cover the second metal pattern (140).

The second insulating layer (150) is, for example, made from silicon nitride (SiNx) or silicon oxide (SiOx), and formed to have a thickness of about 3500 Å~4500 Å. The transparent electrode (160) is made from transparent conductive material through which light can be transmitted. For example, the transparent electrode (160) is made from indium tin oxide (ITO) or indium zinc oxide (IZO), and formed to have a thickness of about 500 Å~600 Å.

A first contact hole (CNT1) that exposes at least a part of the drain electrode (146) is formed in the second insulating layer (150) and the transparent electrode (160). For example, the first contact hole (CNT1) may be formed in a single mask process. The transparent electrode (160) of the first contact hole (CNT1) area may be removed by wet etching, and the second insulating layer (150) of the first contact hole (CNT1) may be removed by dry etching.

Figure 16:
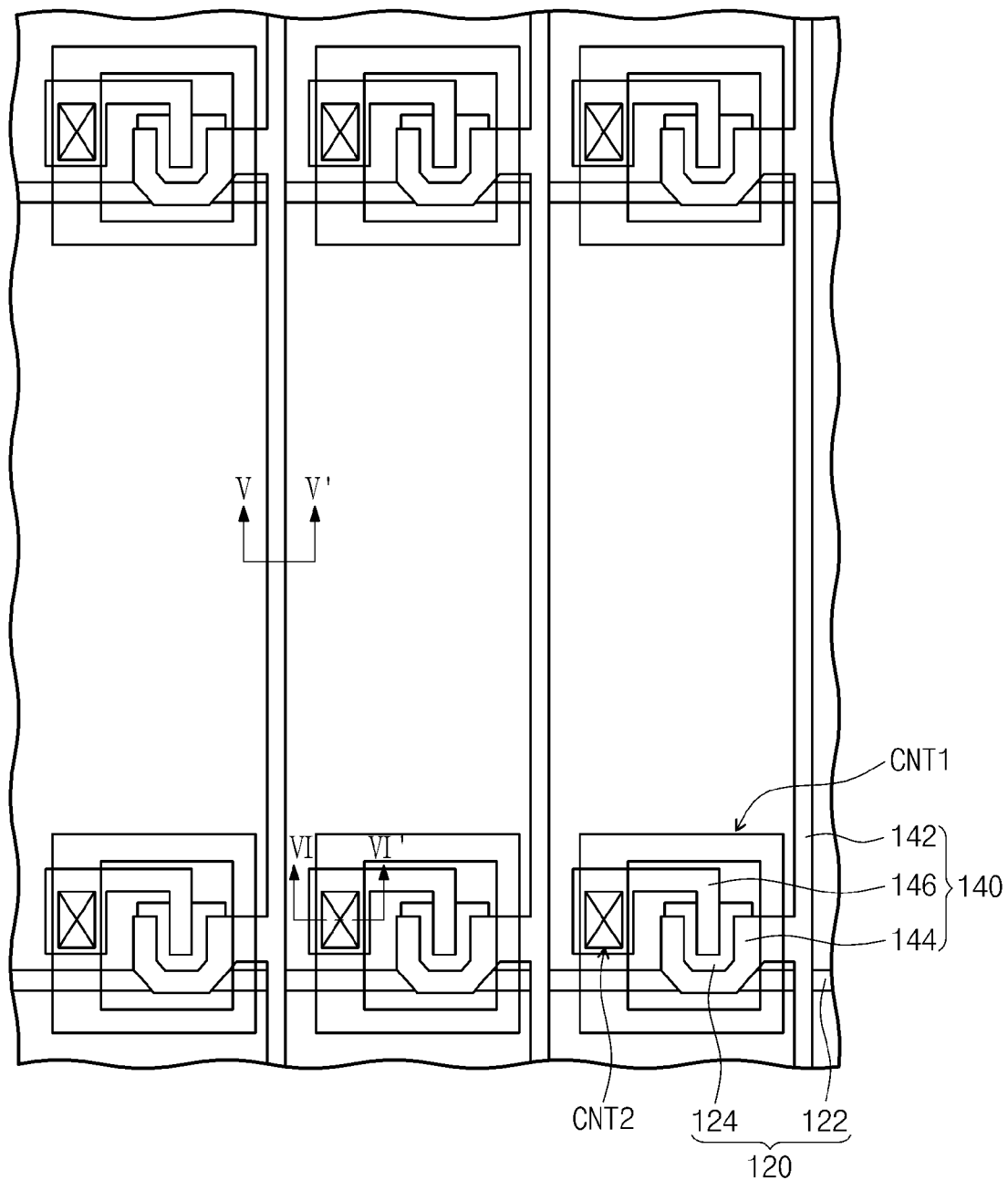
Figure 17:
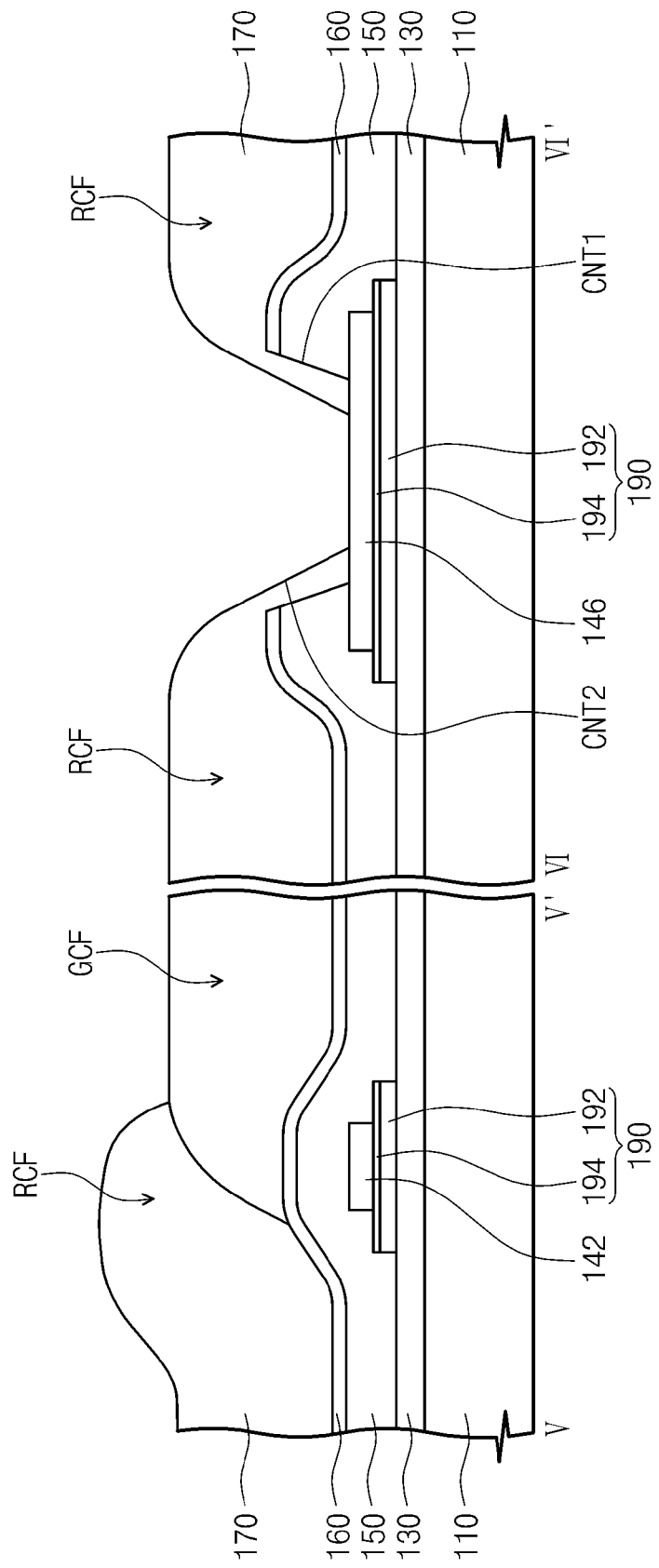

Referring to FIGS. 16 and 17, an organic layer (170) is formed on the transparent electrode (160) on which the first contact hole (CNT1) is formed. The organic layer (170) can flatten the display substrate (100). The organic layer (170) is formed to have a thickness of about 2.5 μm~3.5 μm.

The organic layer (170) may comprise red, green and blue color filters (RCF, GCF, BCF). The red, green and blue color filters (RCF, GCF, BCF) are arranged in order according to each pixel (P). Preferably, at least two of the red, green and blue color filters (RCF, GCF, BCF) are formed to overlap with each other on the data wiring (142).

A second contact hole (CNT2) that exposes at least a part of the drain electrode (146) is formed on the organic layer (170). The second contact hole (CNT2) is formed inside the first contact hole (CNT1) so that the organic layer (170) covers the etched section corresponding to the first contact hole (CNT1) of the second insulating layer (150) and the transparent electrode (160), respectively. Accordingly, the organic layer (170) prevents the transparent electrode (160) and the pixel electrode (180) from being shorted with each other in the first contact hole (CNT1) area.

Then, the pixel electrode (180) is formed on the organic layer (170) being insulated from the transparent electrode (160) as shown in FIGS. 2 and 3. The pixel electrode (180) is made from transparent conductive material through which light can be transmitted. For example, the pixel electrode (180) is made from indium tin oxide (ITO) or indium zinc oxide (IZO), and formed to have a thickness of about 500 Å~600 Å.

The pixel electrode (180) is electrically connected to the drain electrode (146) through the second contact hole (CNT2) formed in the organic layer (170). In here, because the organic layer (170) covers the etched section of the first contact hole (CNT1), the pixel electrode (180) and the transparent electrode (160) do not come in contact with each other. The pixel electrode fully overlaps the transparent electrode (160) to form the storage capacitor (Cst).

FIGS. 18 to 21 are sectional views showing a method of manufacturing a display substrate shown in FIGS. 4 and 5. In FIGS. 18 to 21, the steps up to the forming of the second metal pattern are same as described in relation to FIGS. 10 to 13, and therefore, the overlapping detailed description thereof is omitted.

Figure 18:
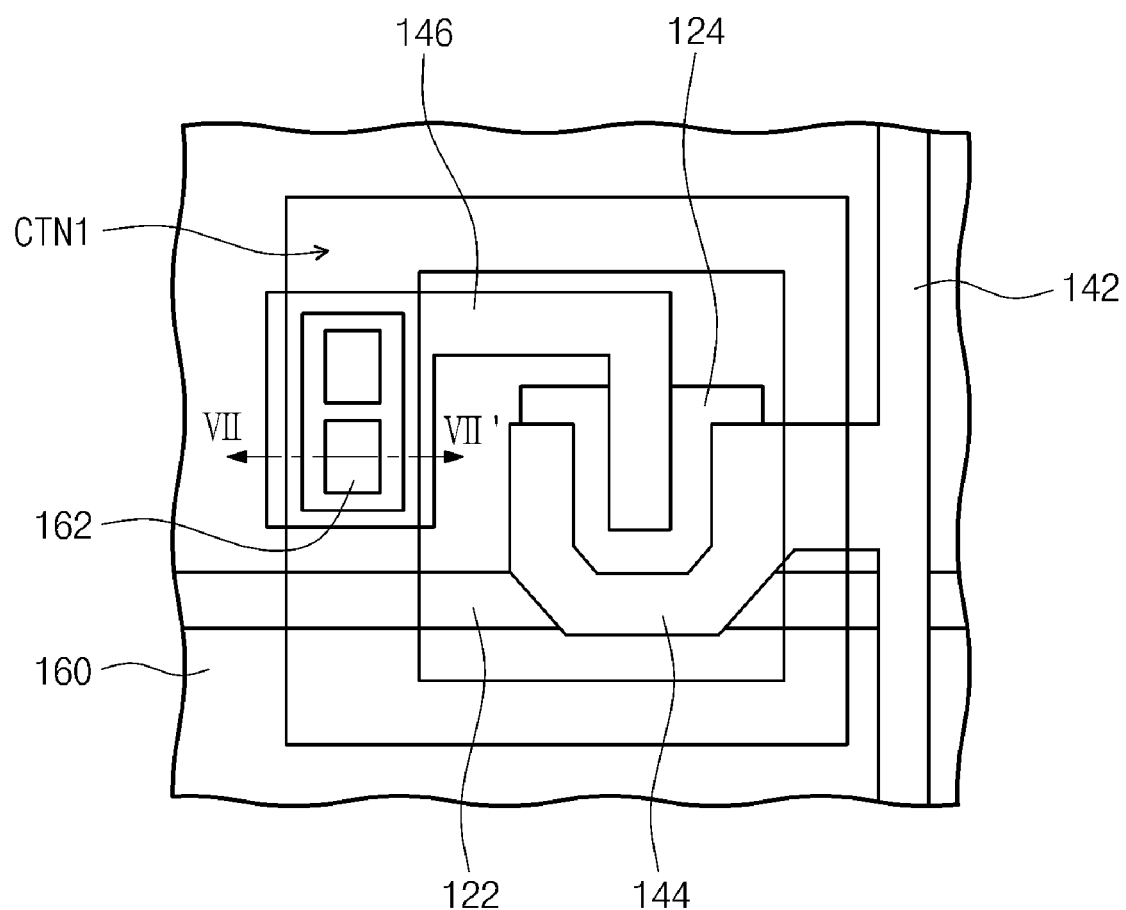
FIGS. 18 to 21 are sectional views showing a method of manufacturing a display substrate shown in FIGS. 4 and 5.
Figure 19:
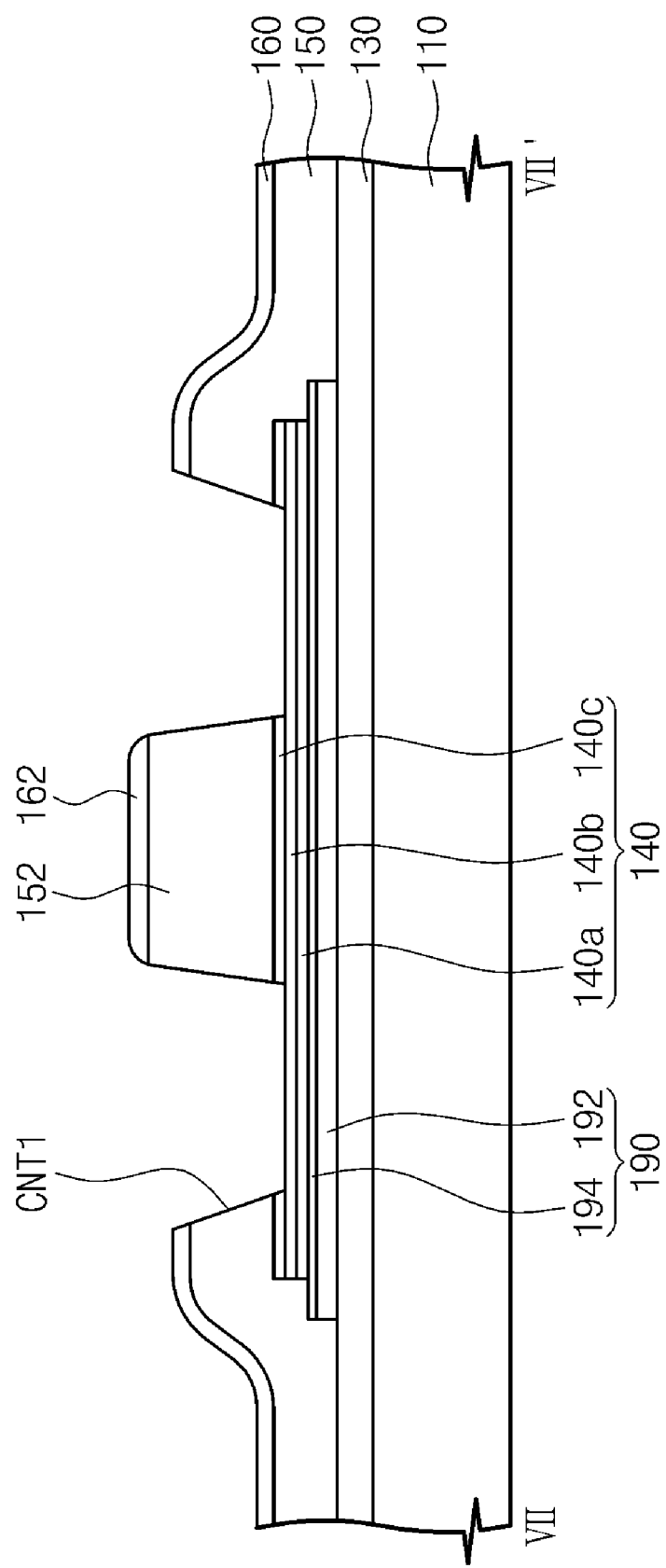

Referring to FIGS. 18 and 19, a second insulating layer (150) and a transparent electrode (160) are sequentially formed on the base substrate (110) on which the second metal pattern (140) is formed to cover the second metal pattern (140).

A first contact hole (CNT1) that exposes at least a part of the drain electrode (146) is formed in the second insulating layer (150) and the transparent electrode (160). A dummy insulating layer (152) and a dummy transparent electrode (162) are formed on the drain electrode (146) that is exposed by the first contact hole (CNT1). The dummy insulating layer (152) is made from the same material as the second insulating layer (150) and the dummy transparent electrode (162) is made from the same material as the transparent electrode (160).

The first contact hole (CNT1) is formed in a single mask process. The transparent electrode (160) of the first contact hole (CNT1) area is removed by wet etching, and the second insulating layer (150) of the first contact hole (CNT1) is removed by dry etching. In the present embodiment, the upper molybdenum (140c) of the drain electrode (146) exposed by the first contact hole (CNT1) is removed by overetching when the second insulating layer (150) is dry etched.

Figure 20:
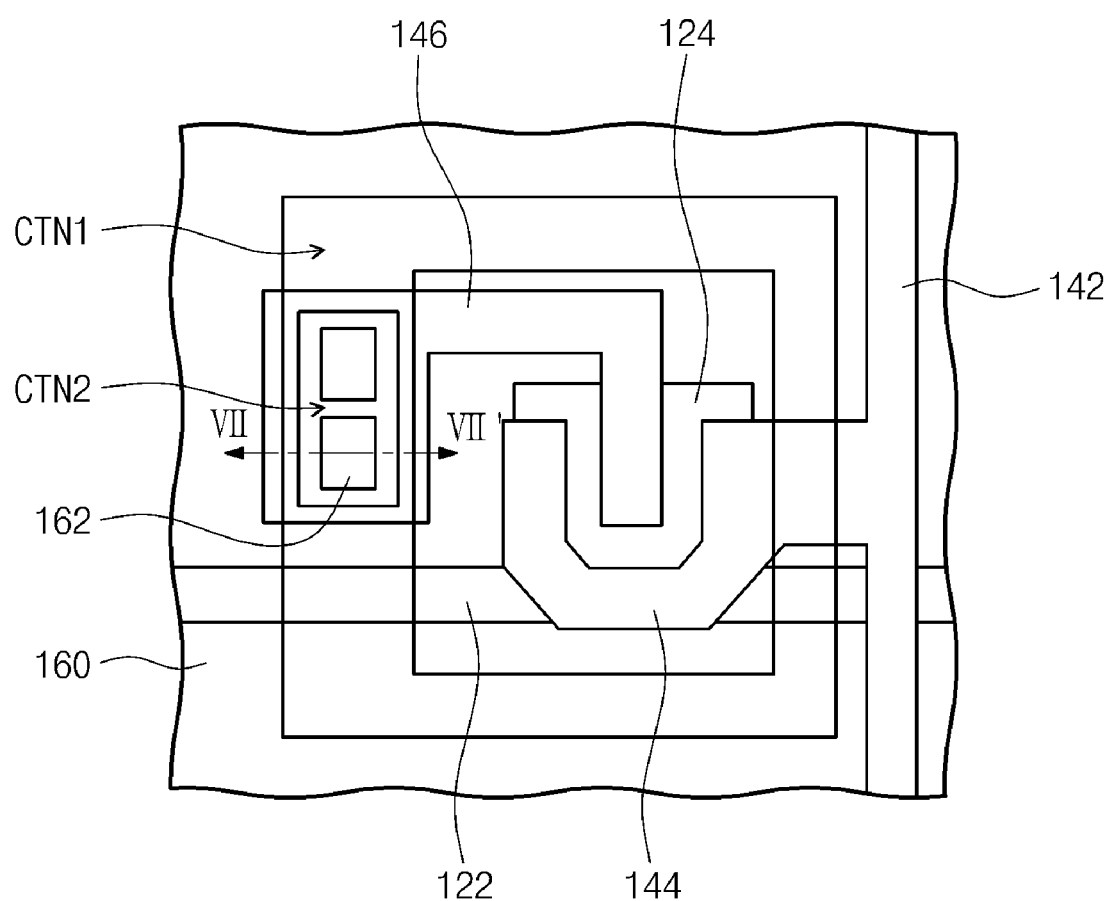
Figure 21:
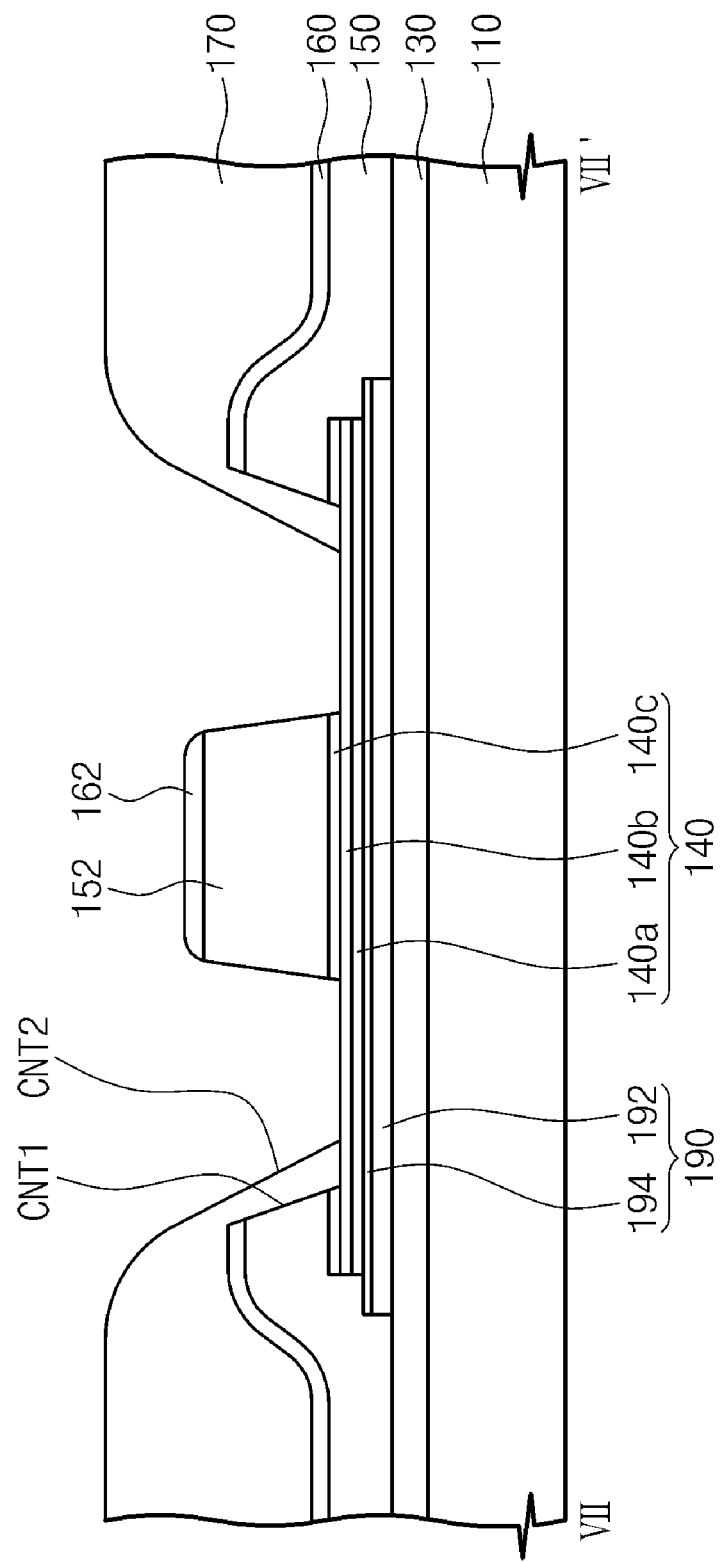

Referring to FIGS. 20 and 21, the second contact hole (CNT2) exposing at least a part of the drain electrode (146) is formed on the organic layer (170) after the organic layer (170) is formed on the transparent electrode (160) in which the first contact hole (CNT1) is formed. The organic layer (170) may include red, green and blue color filters. The organic layer (170) covers the etched section corresponding to the first contact hole (CNT1) of the second insulating layer (150) and the transparent electrode (160) so as to prevent the transparent electrode (160) and the pixel electrode (180) from contacting each other in the first contact hole (CNT1) area.

Referring to FIGS. 4 and 5, a pixel electrode (180) is formed on the organic layer (170) according to each pixel (P) being insulated with the transparent electrode (160).

The upper molybdenum layer (140c) is formed in the area in which the dummy insulating layer (152) is formed, but is not formed in any other area inside the first contact hole (CNT1). Thus, the pixel electrode (180) contacts the side of the upper molybdenum layer (140c) remaining under the dummy insulating layer (152), and the contact reliability between the drain electrode (146) and the pixel electrode (180) is improved.

Hereinafter, a display device according to the present invention will be described. A display substrate (100) may have the same structure as the embodiments described in FIGS. 1 to 19, and therefore, detailed description thereof is omitted.

Figure 22:
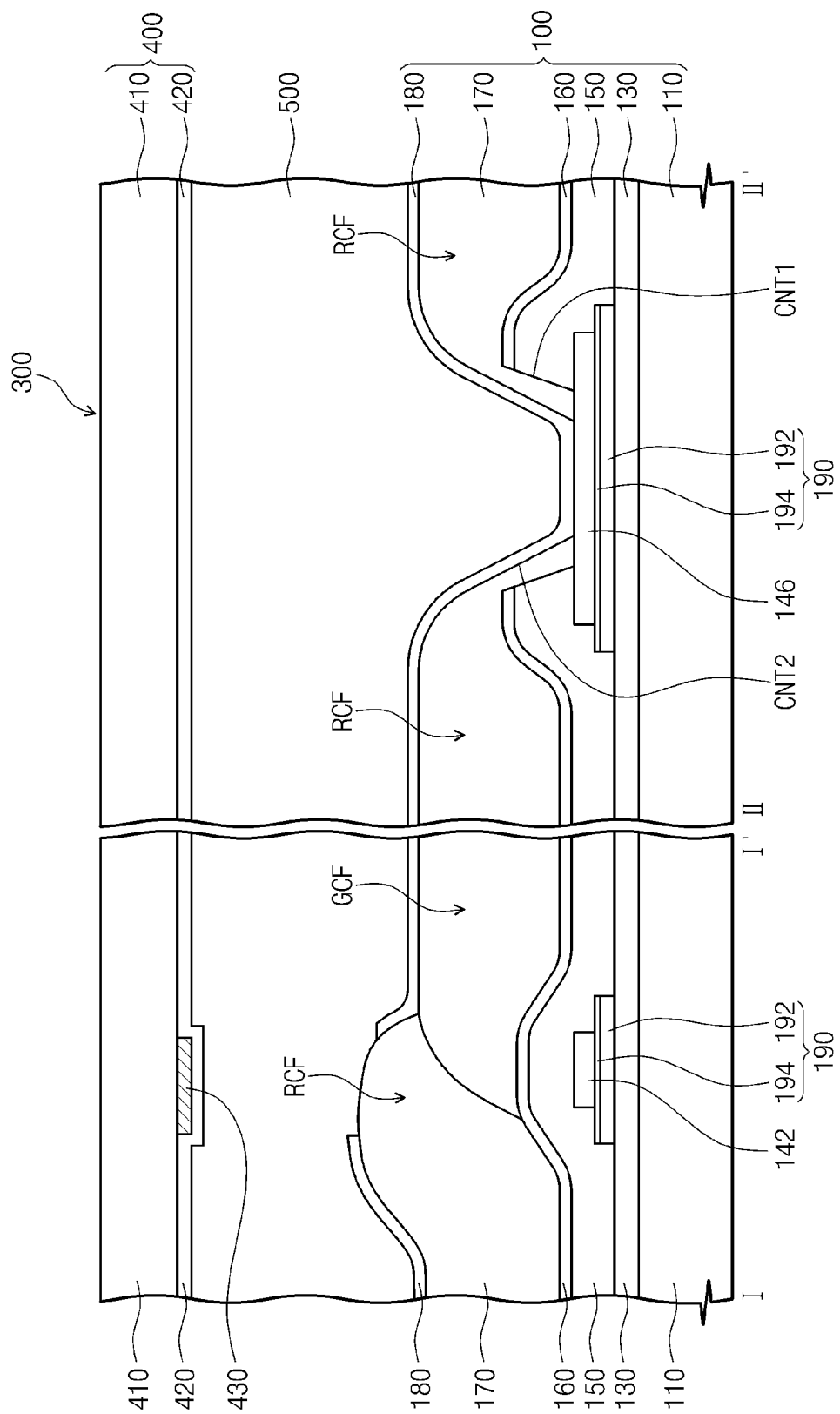
FIG. 22 is a cross sectional view of a display device according to a first exemplary embodiment of the present invention.

FIG. 22 is a cross sectional view of a display device according to a first exemplary embodiment of the present invention.

Referring to FIG. 22, a display device (300) includes a display substrate (100) and a counter substrate (500) and a liquid crystal layer (500).

The counter substrate (400) is disposed opposite the display substrate (100) with the liquid crystal layer (500) therebetween. The counter substrate (400) may include an upper substrate (410) opposite the display substrate (100) and a common electrode (420) formed on the upper substrate (410). The common electrode (420) is made from transparent conductive material for transmission of light. For example, the common electrode (420) is made from indium zinc oxide (IZO) or indium tin oxide (ITO), which is the same material as the pixel electrode (180). Opening patterns may be formed on the common electrode (420) to realize a wide viewing angle.

The counter substrate (400) may further include a black matrix (430). The black matrix is formed on the boundary area between the pixels (P) so that it can block light leakage and improve contrast ratio. A width of the black matrix (430) can be reduced and the aperture ratio can be improved by overlapping the red, green and blue color filters (RCF, GCF, BCF) that are formed on the display substrate (100).

In the event that color filters are not formed on the display substrate (100), the counter substrate (400) may include the color filters.

The liquid crystal layer (500) has a structure that the liquid crystals which have electrical properties such as dielectric anisotropy are arranged in a certain structure. The liquid crystal arrangement is changed by the electric field generated between the pixel electrode (180) and the common electrode (420). The liquid crystal layer (500) controls the light transmittance according to the change of the liquid crystal arrangement.

As described above, the display substrates, the methods of manufacturing the display substrates and the display device according to the embodiments and the modifications of the present invention have one or more following advantages.

First, by using the transparent electrode (160) for the electrode that forms storage capacitor (Cst) opposite the pixel electrode (180), the aperture ratio can be increased to a maximum.

Second, by overlapping the same area of the pixel electrode (180) and the transparent electrode (160) with the organic layer (170) therebetween, capacitance of the storage capacitor (Cst) can be increased, which results in minimization of flicker and kick-back.

Third, by disposing the transparent electrode to which the direct current voltage is applied between the pixel electrode (180) and the data wiring (142), the parasitic capacitance generated between the pixel electrode (180) and the data wiring (142) can be minimized, and due to the above, inferiority like a longitudinal spot generated from the declination of capacitance by miss-alignment between the pixel electrode (180) and the data wiring (142) can be prevented.

Fourth, by disposing the transparent electrode (160) on the data wiring (142), the parasitic capacitance between the data wiring (142) and the common electrode of the counter substrate and the pixel electrode (180) can be minimized and the load applied to the data wiring (142) can be reduced, which results in the reduction of the delay of the pixel voltage through the data wiring (142).

Fifth, by disposing the transparent electrode (160) on the data wiring (142), the coupling between the data wiring (143) to which the swing pixel voltage is applied and the common electrode of the counter substrate to which the common voltage (Vcom) is applied can be prevented.

Sixth, by forming the transparent electrode to cover at least the gate wiring, the data wiring and the active pattern, the gate wiring and the data wiring can be prevented from being damaged during the dry etching process for the second insulating layer. In addition, by forming the transparent electrode to cover an entire area of each pixel other than the area corresponding to the first contact hole and forming the first contact hole to expose only a part of the drain electrode, DC voltage can be applied to the transparent electrode on the active pattern, and the threshold voltage of the thin film transistor can be controlled by changing the level of the DC voltage applied to the transparent electrode.

Although exemplary embodiments of the present invention have been described, it is understood that the present invention should not be limited to these exemplary embodiments but various changes and modifications can be made by one of ordinary skilled in the art within the spirit and scope of the present invention.

What is claimed is:

1. A display substrate, comprising:
   A base substrate;
   A first metal pattern formed on the base substrate and including a gate wiring and a gate electrode;
   A first insulating layer formed on the base substrate covering the first metal pattern;
   A second metal pattern formed on the first insulating layer including a data wiring crossing the gate wiring, a source electrode connected to the data wiring and a drain electrode separated from the source electrode;
   A second insulating layer formed on the base substrate covering the second metal pattern;
   A transparent electrode formed on the second insulating layer;
   An organic layer formed on the transparent electrode; and
   A pixel electrode formed on the organic layer, the pixel electrode being insulated from the transparent electrode, and being in contact with the drain electrode.

2. The display substrate as recited in claim 1, wherein the organic layer comprises red, green and blue color filters.

3. The display substrate as recited in claim 2, wherein at least two of the red, green and blue color filters overlap with each other on the data wiring.

4. The display substrate as recited in claim 1, further comprising:
   A first contact hole formed in the second insulating layer and the transparent electrode respectively, and exposing at least a part of the drain electrode; and
   A second contact hole formed in the organic layer, and exposing at least a part of the drain electrode inside of the first contact hole.

5. The display substrate as recited in claim 4, wherein the organic layer covers an etched section corresponding to the first contact hole of the second insulating layer and the transparent electrode, respectively.

6. The display substrate as recited in claim 1, further comprising an active pattern formed between the first insulating layer and the second metal pattern.

7. The display substrate as recited in claim 6, wherein the transparent electrode covers at least the gate wiring, the data wiring and the active pattern.

8. The display substrate as recited in claim 1, wherein the edge of the pixel electrode overlaps the data wiring.

9. A display substrate, comprising:
   A base substrate;
   A first metal pattern formed on the base substrate and including a gate wiring and a gate electrode;
   A first insulating layer formed on the base substrate covering the first metal pattern;
   An active pattern formed on the first insulating layer;
   A second metal pattern formed on the first insulating layer on which the active layer is formed including a data wiring crossing the gate wiring, a source electrode connected to the data wiring and a drain electrode separated from the source electrode;
   A second insulating layer formed on the base substrate covering the second metal pattern;
   A transparent electrode formed on the second insulating layer covering at least the gate wiring, the data wiring and the active pattern;
   Color filter including at least one of red, green or blue color filters and formed on the transparent electrode; and
   A pixel electrode formed on the color filter, the pixel electrode being insulated from the transparent electrode, and being in contact with the drain electrode.

10. The display substrate as recited in claim 9, further comprising:
    A first contact hole formed in the second insulating layer and the transparent electrode respectively, and exposing at least a part of the drain electrode; and,
    A second contact hole formed in the color filter, and exposing at least a part of the drain electrode inside of the first contact hole.

11. The display substrate as recited in claim 10, wherein the transparent electrode covers the entire area of each pixel defined on the base substrate other than the area corresponding to the first contact hole, and wherein
    the first contact hole exposes only a part of the drain electrode.

12. The display substrate as recited in claim 10, wherein the color filter covers an etched section corresponding to the first contact hole of the second insulating layer and the transparent electrode, respectively.

13. A method of manufacturing a display substrate, comprising:
    Forming a first metal pattern including a gate wiring and a gate electrode connected to the gate wiring on a base substrate;
    Forming a first insulating layer covering the first metal pattern on the base substrate on which the first metal pattern is formed;
    Forming an active pattern on the first insulating layer;
    Forming a second metal pattern including a data wiring crossing the gate wiring, a source electrode connected to the data wiring and a drain electrode separated from the source electrode, on the base substrate on which the active pattern is formed;
    Forming a second insulating layer covering the second metal pattern, on the base substrate on which the second metal pattern is formed;
    Forming a transparent electrode on the second insulating layer;
    Forming an organic layer on the transparent electrode; and
    Forming a pixel electrode insulated from the transparent electrode and being in contact with the drain electrode, on the organic layer.

14. The method as recited in claim 13, wherein the organic layer comprises red, green, blue color filters.

15. The method as recited in claim 14, wherein at least two of the red, green and blue color filters overlap with each other on the data wiring.

16. The method as recited in claim 13, further comprising:
    Forming a first contact hole exposing at least a part of the drain electrode, in the second insulating layer and the transparent electrode, respectively; and Forming a second contact hole exposing at least a part of the drain electrode inside the first contact hole, in the organic layer.

17. The method as recited in claim 16, wherein the organic layer covers an etched section corresponding to the first contact hole of the second insulating layer and the transparent electrode, respectively.

18. The method as recited in claim 13, wherein the transparent electrode covers at least the gate wiring, the data wiring and the active pattern.

19. A method of manufacturing a display substrate, comprising:
Forming a first metal pattern including a gate wiring and a data wiring connected to the gate wiring, on a base substrate;
Forming a first insulating layer, an active layer and a metal layer in sequence, on the base substrate on which the first metal pattern is formed;
Forming a second metal pattern including a data wiring, a source electrode and a drain electrode connected to the data wiring, and an active pattern disposed between the second metal pattern and the first insulating layer, by patterning the metal layer and the active layer in a single mask process;
Forming a second insulating layer covering the second metal pattern, on the base substrate on which the second metal pattern is formed;
Forming a transparent electrode on the second insulating layer;
Forming an organic layer on the transparent electrode; and
Forming a pixel electrode insulated from the transparent electrode and being in contact with the drain electrode, on the organic layer.

20. A display device comprising:
A display substrate;
A counter substrate opposite the display substrate; and
A liquid crystal layer disposed between the display substrate and the counter substrate, and,
The display substrate comprising:
A base substrate;
A first metal pattern formed on the base substrate and including a gate wiring and a gate electrode;
A first insulating layer formed on the base substrate covering the first metal pattern;
A second metal pattern formed on the first insulating layer including a data wiring crossing the gate wiring, source electrode connected to the data wiring and drain electrode separated from the source electrode;
A second insulating layer formed on the base substrate covering the second metal pattern;
A transparent electrode formed on the second insulating layer;
An organic layer formed on the transparent electrode; and
A pixel electrode formed on the organic layer being insulated from the transparent electrode, and being in contact with the drain electrode.

21. The method as recited in claim 20, wherein the organic layer comprises red, green, blue color filters.

22. The display device as recited in claim 20, further comprising:
A first contact hole formed in the second insulating layer and the transparent electrode respectively, and exposing at least a part of the drain electrode; and,
A second contact hole formed in the organic layer, and exposing at least a part of the drain electrode inside of the first contact hole,
wherein, the transparent electrode covers at least the gate wiring, the data wiring and the active pattern.

23. The display substrate as recited in claim 22, wherein the transparent electrode covers the entire area of each pixel defined on the base substrate except the area corresponding to the first contact hole, and,
the first contact hole is formed to expose only a part of the drain electrode.

24. A display device comprising:
A display substrate;
A counter substrate opposite the display substrate; and
A liquid crystal layer disposed between the display substrate and the counter substrate, and,
The display substrate comprising:
A base substrate;
A first metal pattern formed on the base substrate and including a gate wiring and a gate electrode;
A first insulating layer formed on the base substrate covering the first metal pattern;
An active pattern formed on the first insulating layer;
A second metal pattern formed on the first insulating layer on which the active layer is formed including a data wiring crossing the gate wiring, a source electrode connected to the data wiring and a drain electrode separated from the source electrode;
A second insulating layer formed on the base substrate covering the second metal pattern;
A transparent electrode formed on the second insulating layer covering at least the gate wiring, the data wiring and the active pattern;
Color filter including at least one of red, green or blue color filters and formed on the transparent electrode; and
A pixel electrode formed on the color filter being insulated from the transparent electrode, and being in contact with the drain electrode.

25. The display device as recited in claim 24, further comprising:
A first contact hole formed in the second insulating layer and the transparent electrode respectively, and exposing at least a part of the drain electrode; and,
A second contact hole formed in the color filter, and exposing at least a part of the drain electrode inside of the first contact hole,
wherein, the transparent electrode covers at least the gate wiring, the data wiring and the active pattern, and,
the transparent electrode covers the entire area of each pixel defined on the base substrate except the area corresponding to the first contact hole, and,
the first contact hole is formed to expose only a part of the drain electrode.

* * * * *